(12) United States Patent
Okumura et al.

(10) Patent No.: US 8,324,685 B2
(45) Date of Patent: Dec. 4, 2012

(54) SEMICONDUCTOR DEVICE HAVING A FIN-TYPE SEMICONDUCTOR REGION

(75) Inventors: Tomohiro Okumura, Osaka (JP); Takayuki Kai, Kyoto (JP); Yuichiro Sasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 57 days.

(21) Appl. No.: 12/866,649

(22) PCT Filed: Jan. 20, 2010

(86) PCT No.: PCT/JP2010/000285
§ 371 (c)(1),
(2), (4) Date: Aug. 6, 2010

(87) PCT Pub. No.: WO2010/092748
PCT Pub. Date: Aug. 19, 2010

(65) Prior Publication Data
US 2011/0049628 A1    Mar. 3, 2011

(30) Foreign Application Priority Data
Feb. 12, 2009  (JP) .................. 2009-029564

(51) Int. Cl.
*H01L 27/12* (2006.01)
(52) U.S. Cl. . 257/347; 438/164; 438/165; 257/E21.466; 257/368

(58) Field of Classification Search .................. 257/347, 257/368
See application file for complete search history.

(56) References Cited

U.S. PATENT DOCUMENTS

| | | | |
|---|---|---|---|
| 4,912,065 A | 3/1990 | Mizuno et al. | |
| 4,937,205 A | 6/1990 | Nakayama et al. | |
| 5,804,471 A | 9/1998 | Yamazaki et al. | |
| 2004/0099903 A1* | 5/2004 | Yeo et al. ...................... | 257/317 |
| 2004/0235281 A1 | 11/2004 | Downey et al. | |
| 2006/0157749 A1 | 7/2006 | Okuno | |
| 2007/0042578 A1 | 2/2007 | Sasaki et al. | |
| 2007/0166846 A1 | 7/2007 | Sasaki et al. | |
| 2008/0050897 A1 | 2/2008 | Kottantharayil | |
| 2008/0179683 A1 | 7/2008 | Sasaki et al. | |
| 2009/0026540 A1 | 1/2009 | Sasaki et al. | |
| 2009/0289300 A1 | 11/2009 | Sasaki et al. | |
| 2010/0095889 A1 | 4/2010 | Kai et al. | |

(Continued)

FOREIGN PATENT DOCUMENTS

JP   01-295416   11/1989

(Continued)

OTHER PUBLICATIONS

Quirk, Michael, Semiconductor manufacturing technology, 2001, Prentice Hall, p. 35.*

(Continued)

*Primary Examiner* — Marcos D. Pizarro
*Assistant Examiner* — Eva Yan Montalvo
(74) *Attorney, Agent, or Firm* — McDermott Will & Emery LLP

(57) ABSTRACT

A fin-semiconductor region (13) is formed on a substrate (11). A first impurity which produces a donor level or an acceptor level in a semiconductor is introduced in an upper portion and side portions of the fin-semiconductor region (13), and oxygen or nitrogen is further introduced as a second impurity in the upper portion and side portions of the fin-semiconductor region (13).

8 Claims, 12 Drawing Sheets

U.S. PATENT DOCUMENTS

| | | |
|---|---|---|
| 2011/0049628 A1 | 3/2011 | Okumura et al. |
| 2011/0151652 A1 | 6/2011 | Sssaki et al. |

FOREIGN PATENT DOCUMENTS

| | | |
|---|---|---|
| JP | 6-260436 | 9/1994 |
| JP | 2006-196821 | 7/2006 |
| JP | 2007-535174 | 11/2007 |
| JP | 2008-053725 | 3/2008 |
| JP | 2010-050188 | 3/2010 |
| JP | 4598886 | 10/2010 |
| WO | WO 2005/036626 A1 | 4/2005 |
| WO | WO 2006/064772 A1 | 6/2006 |
| WO | WO 2008/090771 A1 | 7/2008 |
| WO | WO 2009/016778 A1 | 2/2009 |
| WO | WO 2010/092748 A1 | 8/2010 |

OTHER PUBLICATIONS

Front page of published International Application and English translation of the International Search Report for International Application No. PCT/JP2010/000285 filed Jan. 20, 2010.

D. Lenoble et al., "Enhanced performance of PMOS MUGFET via integration of conformable plasma-doped source/drain extensions," 2006, Symposium of VLSI Technology Digest of Technical Papers, pp. 212.

* cited by examiner (a)

(b)

(c)

(d)

(e)

(a)

(b)

(c)

(a)

(b)

(c)

(d)

(a)

(b)

(c)

(d)

(a)

(b)

(c)

(d)

(a)

(b)

SEMICONDUCTOR DEVICE HAVING A FIN-TYPE SEMICONDUCTOR REGION

RELATED APPLICATIONS

This application is the U.S. National Phase under 35 U.S.C. §371 of International Application No. PCT/JP2010/000285, filed on Jan. 20, 2010, which in turn claims the benefit of Japanese Application No. 2009-029564, filed on Feb. 12, 2009, the disclosures of which Applications are incorporated by reference herein.

TECHNICAL FIELD

The present disclosure relates to a semiconductor device, a method for fabricating the same, and a plasma doping system, and particularly to a semiconductor device of a three-dimensional structure having a fin-type semiconductor region on a substrate, and a method for fabricating the same.

BACKGROUND ART

In recent years, as semiconductor devices have become higher in integration, functionality, and speed, demand for miniaturization of the semiconductor devices has been growing. To satisfy the demand, various device structures have been proposed for reducing the area occupied by transistors over a substrate. Among them, a field effect transistor having a fin-type structure has drawn attention. The field effect transistor having the fin-type structure is generally called a fin-FET (Fin-Field Effect Transistor), and has an active region made of a semiconductor region (hereinafter referred to as a fin-semiconductor region) having a thin-wall (fin) shape perpendicular to the principal surface of a substrate. In the fin-FET, the both side surfaces of the fin-semiconductor region can be used as channel surfaces, and accordingly the area occupied by transistors over the substrate can be reduced (see, e.g., Patent Document 1 and Non-Patent Document 1).

FIGS. 12(a)-12(d) are views each showing a structure of a conventional fin-FET, of which FIG. 12(a) is a plan view, FIG. 12(b) is a cross-sectional view along the line A-A in FIG. 12(a), FIG. 12(c) is a cross-sectional view along the line B-B in FIG. 12(a), and FIG. 12(d) is a cross-sectional view along the line C-C in FIG. 12(a).

As shown in FIGS. 12(a)-12(d), the conventional fin-FET has a support substrate 101 made of silicon, an insulating layer 102 made of silicon dioxide formed on the support substrate 101, fin-semiconductor regions 103a-103d formed on the insulating layer 102, a gate electrode 105 formed over the fin-semiconductor regions 103a-103d with gate insulating films 104a-104d being interposed therebetween, insulating sidewall spacers 106 formed on the side surfaces of the gate electrode 105, extension regions 107 formed in the both side regions of the fin-semiconductor regions 103a-103d with the gate electrode 105 being interposed therebetween, and source/drain regions 117 formed in the both side regions of the fin-semiconductor regions 103a-103d with the gate electrode 105 and the insulating sidewall spacers 106 being interposed therebetween. The fin-semiconductor regions 103a-103b are disposed on the insulating layer 102 to be arranged at given intervals in a gate width direction. The gate electrode 105 is formed so as to extend over the fin-semiconductor regions 103a-103d in the gate width direction. Each of the extension regions 107 includes a first impurity region 107a formed in the upper portion of each of the fin-semiconductor regions 103a-103d, and second impurity regions 107b formed in the side portions of each of the fin-semiconductor regions 103a-103d. Each of the source/drain regions 117 includes a third impurity region 117a formed in the upper portion of each of the fin-semiconductor regions 103a-103d, and fourth impurity regions 117b formed in the side portions of each of the fin-semiconductor regions 103a-103d. Note that a description and depiction of pocket regions is omitted.

FIGS. 13(a)-13(d) are cross-sectional views showing a method for fabricating the conventional semiconductor device in the order of process steps. Note that FIGS. 13(a)-13(d) correspond to a cross-sectional structure along the line C-C in FIG. 12(a). In FIGS. 13(a)-13(d), the same components as those of the structure shown in FIGS. 12(a)-12(d) are provided with the same reference characters, and an overlapping description is omitted.

First, as shown in FIG. 13(a), a SOI (Silicon On Insulator) substrate is prepared in which a semiconductor layer made of silicon is provided over the support substrate 101 made of silicon with the insulating layer 102 made of silicon dioxide being interposed therebetween. Then, the semiconductor layer is patterned to form the fin-semiconductor region 103b serving as an active region.

Next, as shown in FIG. 13(b), a gate insulating film 104 is formed on the surface of the fin-semiconductor region 103b, and then a polysilicon film 105A is formed over the entire surface of the support substrate 101.

Next, as shown in FIG. 13(c), the polysilicon film 105A and the gate insulating film 104 are successively etched to form the gate electrode 105 over the fin-semiconductor region 103b with the gate insulating film 104b being interposed therebetween. Then, using the gate electrode 105 as a mask, impurity ions are implanted into the semiconductor region 103b to form the extension regions 107 and the pocket regions (not shown).

Next, as shown in FIG. 13(d), an insulating film is formed over the entire surface of the support substrate 101, and then etched back using anisotropic dry etching, thereby forming the insulating sidewall spacers 106 on the side surfaces of the gate electrode 105. Then, using the gate electrode 105 and the insulating sidewall spacers 106 as a mask, impurity ions are implanted into the semiconductor region 103b to form the source/drain regions 117.

By the foregoing process steps, a fin-MISFET (Metal Insulator Semiconductor Field Effect Transistor) having the gate electrode 105 formed over the fin-semiconductor region 103b with the gate insulating film 104b being interposed therebetween can be obtained.

FIG. 14(a) is a cross-sectional view showing the step of forming the extension regions of a fin-FET in Patent Document 1. FIG. 14(b) is a cross-sectional view showing the step of forming the extension regions of a fin-FET in Non-Patent Document 1. Note that FIGS. 14(a) and 14(b) correspond to a cross-sectional structure (prior to the formation of the insulating sidewall spacers 106) along the line B-B in FIG. 12(a). In FIGS. 14(a) and 14(b), the same components as those of the structure shown in FIGS. 12(a)-12(d) are provided with the same reference characters, and an overlying description is omitted.

As shown in FIG. 14(a), in the method disclosed in Patent Document 1, in order to introduce an impurity not only into the upper surfaces of the fin-semiconductor regions 103a-103d, but also into the side surfaces thereof, ions 108a and 108b are implanted at respective implantation angles inclined to the opposite sides of a vertical direction into the fin-semiconductor regions 103a-103d, thereby forming the extension regions 107. In this case, in the upper portions of the fin-semiconductor regions 103a-103d, the first impurity regions 107a are formed in which both of the ions 108a and 108b have been implanted. However, in the side portions of the fin-semiconductor regions 103a-103d, the second impurity regions 107b are formed in which either the ions 108a or the ions 108b have been implanted. That is, when the dosage of the ions 108a and the dosage of the ions 108b are the same, the implantation dosage in each of the first impurity regions 107a has a magnitude double that of the implantation dosage in each of the second impurity regions 107b.

On the other hand, as shown in FIG. 14(b), in the method disclosed in Non-Patent Document 1, the extension regions 107 are formed in the fin-semiconductor regions 103a-103d using a plasma doping process. When impurity introduction is performed using the plasma doping process, the first impurity regions 107a each having an introduction dosage determined by the balance among introduced ions 109a, adsorbed species (neutral species such as gas molecules and radicals) 109b, and impurities 109c desorbed by sputtering from the fin-semiconductor regions 103a-103d are formed in the upper portions of the fin-semiconductor regions 103a-103d. However, as for the introduction dosage in each of the side portions of the fin-semiconductor regions 103a-103d, it is less affected by the introduced ions 109a or the impurities 109c desorbed by sputtering so that the second impurity regions 107b each having the introduction dosage primarily determined by the adsorbed species 109b are formed in the side portions of the fin-semiconductor regions 103a-103d. As a result, the introduction dosage in the first impurity region 107a is higher than the introduction dosage in the second impurity region 107b by, e.g., about 25%.

Thus, according to the method for forming the extension regions of the conventional fin-FET, the introduction dosage in each of the first impurity regions 107a formed in the upper portions of the fin-semiconductor regions 103a-103d is higher than the introduction dosage in each of the second impurity regions 107b formed in the side portions of the fin-semiconductor regions 103a-103d. In addition, the junction depth of the second impurity region 107b is shallower than the junction depth of the first impurity region 107a. As a result, the sheet resistance, specific resistance, or spreading resistance of the first impurity region 107a is lower than the sheet resistance, specific resistance, or spreading resistance of the second impurity region 107b. Note that, when it is assumed that the sheet resistance of a target object is Rs, the resistivity (specific resistance) thereof is $\rho$, the thickness (junction depth) thereof is t, and the spreading resistance thereof is $\rho w$, $Rs=\rho/t$ is satisfied. In addition, as represented by a relational expression $\rho w = CF \times k \times \rho/(2\pi r)$ widely known in the measurement of a spreading resistance, the resistivity (specific resistance) $\rho$ and the spreading resistance $\rho w$ are basically in one-to-one relation so that an expression $Rs \propto \rho w/t$ is obtained.

In the relational expression shown above, CF is a correction term (CF=1 in the case where there is no correction) in which the volume effect of the spreading resistance $\rho w$ is considered, k is a correction term (k=1 when the sample is, e.g., p-type silicon, and k=1 to 3 when the sample is, e.g., n-type silicon) in which polarity dependence in a Schottky barrier between a probe and a sample is considered, and r is the radius of curvature of the tip of the probe.

When the fin-FET having such an extension structure is operated, a current flowing in each of the extension regions 107 is localized to the first impurity region 107a having the introduction dosage higher (i.e., sheet resistance lower) than that in the second impurity region 107b. As a result, the problem arises that desired transistor characteristics cannot be obtained.

In the conventional fin-FET, the source/drain regions are also formed using the same ion implantation process or the same plasma doping process as that used to form the extension regions. Accordingly, in the source/drain regions 117 also, the introduction dosage in each of the third impurity regions 117a formed in the upper portions of the fin-semiconductor regions 103a-103d is higher than the introduction dosage in each of the fourth impurity regions 117b formed in the side portions of the fin-semiconductor regions 103a-103d. In addition, the junction depth of the fourth impurity region 117b is shallower than the junction depth of the third impurity region 117a. When the fin-FET having such a source/drain structure is operated, a current flowing in each of the source/drain regions 117 is localized to the third impurity region 117a having the introduction dosage higher (i.e., sheet resistance lower) than that in the fourth impurity region 117b. As a result, the problem arises that desired transistor characteristics cannot be obtained.

CITATION LIST

Patent Documents

PATENT DOCUMENT 1: Japanese Laid-Open Patent Publication No. 2006-196821
PATENT DOCUMENT 2: International Publication No. WO 08/090,771

Non-Patent Document

NON-PATENT DOCUMENT 1: D. Lenoble et al., "Enhanced performance of PMOS MUGFET via integration of conformal plasma-doped source/drain extensions," 2006, Symposium on VLSI Technology Digest of Technical Papers, p. 212

SUMMARY OF THE INVENTION

Technical Problem

To solve the problem described above, a semiconductor device in which impurity regions each having an introduction dosage equal to or more than that in each of the upper portions of fin-semiconductor regions are provided in the side portions of the fin-semiconductor regions and a method for fabricating the same are proposed in, e.g., Patent Document 2. In accordance with the method disclosed in Patent Document 2, in the step of introducing an impurity into the fin-semiconductor regions by a plasma doping process, and thereby forming first impurity regions in the upper portions of the fin-semiconductor regions and forming second impurity regions in the side portions of the fin-semiconductor regions, a plasma doping process is performed under a first condition in which the introduction dosage becomes a first dosage, and then a plasma doping process is performed under a second condition in which the introduction dosage becomes a second dosage lower than the first dosage. This makes it possible to obtain a semiconductor device including impurity regions each having an introduction dosage equal to or more than that in each of the upper portions of the fin-semiconductor regions, i.e., a semiconductor device having desired transistor characteristics.

However, in accordance with the method disclosed in Patent Document 2, it is necessary to change the plasma doping process conditions after the introduction of the impurity has advanced to a degree, and then perform the plasma doping process till the introduction dosage sufficiently approximates the second dosage, which may result in an increased process time.

In view of the foregoing, an object of the present disclosure is to allow a semiconductor device having a fin-semiconductor region to obtain desired characteristics using a plasma doping process, and reduce a process time before the desired characteristics are obtained.

Solution to the Problem

In order to attain the above object, a first method for fabricating a semiconductor device according to the present disclosure includes the steps of: (a) forming a fin-semiconductor region on a substrate; (b) introducing a first impurity which produces a donor level or an acceptor level in a semiconductor into an upper portion and side portions of the fin-semiconductor region by a plasma doping process; and (c) introducing oxygen or nitrogen as a second impurity into the upper portion and side portions of the fin-semiconductor region.

In accordance with the first method for fabricating a semiconductor device according to the present disclosure, the first impurity which produces a donor level or an acceptor level in a semiconductor is introduced into the upper portion and side portions of the fin-semiconductor region, and oxygen or nitrogen, i.e., an impurity which changes a semiconductor into an insulator is further introduced as the second impurity into the upper portion and side portions of the fin-semiconductor region. At this time, by introducing a larger amount of the second impurity into the upper portion of the fin-semiconductor region than into each of the side portions of the fin-semiconductor region, the resistance (specific resistance, sheet resistance, or spreading resistance, which holds true hereinafter) of the side portion of the fin-semiconductor region can be set equal to or less than the resistance of the upper portion of the fin-semiconductor region. Also, by introducing the second impurity which changes a semiconductor into an insulator, it is sufficient for a process time (time required for the step (c)) required to increase the resistance of the upper portion of the fin-semiconductor region to be short. Therefore, it is possible to implement a three-dimensional device having excellent characteristics, such as a FET, with an excellent throughput.

Note that the step (b) may be performed prior to the step (c) or after the step (c).

The amount of the second impurity introduced in the side portion of the fin-semiconductor region is of an order that does not affect the respective characteristics of extension regions and source/drain regions.

As the second impurity which changes a semiconductor into an insulator, oxygen or nitrogen which is introduced into Si and forms an insulator ($SiO_2$ or $SiN_x$) is preferably used if the semiconductor is, e.g., Si. However, it will be appreciated that the second impurity is not limited thereto.

In the first method for fabricating a semiconductor device according to the present disclosure, a plasma doping process or an ion implantation process may be used in the step (c).

The first method for fabricating a semiconductor device according to the present disclosure may further include, after both of the steps (b) and (c) are completed, the step of: (d) removing the upper portion of the fin-semiconductor region. This allows an insulator region formed in the upper portion of the fin-semiconductor region through the introduction of the second impurity therein to be removed. Therefore, it is possible to form a triple-gate FET in which the upper portion and both side portions of the fin-semiconductor region function as a channel. In this case, if a wet etching process is used in the step (d), only a portion where the second impurity which changes a semiconductor into an insulator has been introduced in a large amount can be precisely removed irrespective of an etching time. Alternatively, if a dry etching process is used in the step (d), it is possible to avoid a situation where lateral etching on a gate insulating film (etching from the side surfaces of the gate insulating film) advances.

In the first method for fabricating a semiconductor device according to the present disclosure, at the time when both of the steps (b) and (c) are completed, a resistance of each of the side portions of the fin-semiconductor region may be equal to or less than a resistance of the upper portion of the fin-semiconductor region. The arrangement allows a three-dimensional device having more excellent characteristics, such as a FET, to be implemented.

The first method for fabricating a semiconductor device according to the present disclosure may further include, after the step (a) and prior to both of the steps (b) and (c), the steps of: (e) forming a gate insulating film on at least each of side surfaces of a predetermined portion of the semiconductor region; and (f) forming a gate electrode on the gate insulating film and, in the steps (b) and (c), the first impurity and the second impurity may be introduced into the fin-semiconductor region located outside the gate electrode. The arrangement allows a three-dimensional device having more excellent characteristics, such as a FET, to be implemented.

In the first method for fabricating a semiconductor device according to the present disclosure, the first impurity may be boron, phosphorus, or arsenic. The arrangement allows the effects of the present disclosure described above to be reliably obtained.

Note that, if the second impurity is oxygen or nitrogen in the first method for fabricating a semiconductor device according to the present disclosure, the introduction of the second impurity can be performed using an oxygen gas or a nitrogen gas which is inexpensive and safe. This offers cost and process advantages.

A second method for fabricating a semiconductor device according to the present disclosure includes the steps of: (a) forming a fin-semiconductor region on a substrate; (b) introducing a first impurity which produces a donor level or an acceptor level in a semiconductor into an upper portion and side portions of the fin-semiconductor region by a plasma doping process; and (c) after the step (b), removing the upper portion of the fin-semiconductor region.

In accordance with the second method for fabricating a semiconductor device according to the present disclosure, the first impurity which produces a donor level or an acceptor level in a semiconductor is introduced into the upper portion and side portions of the fin-semiconductor region, and then the upper portion of the fin-semiconductor region is removed. As a result, it is possible to remove a high-concentration first-impurity introduced layer from the upper portion of the fin-semiconductor region, and leave a low-concentration first-impurity introduced layer therein. Accordingly, the resistance of each of the side portions of the fin-semiconductor region can be set equal to or less than the resistance of the upper portion of the fin-semiconductor region. In addition, it is sufficient for a process time (time required for the step (c)) required to remove the upper portion of the fin-semiconductor region to be short. Therefore, it is possible to implement a three-dimensional device having excellent characteristics, such as a FET, with an excellent throughput.

In the second method for fabricating a semiconductor device according to the present disclosure, a dry etching process may be used in the step (c). The arrangement allows the avoidance of a situation where lateral etching on a gate insulating film (etching from the side surfaces of the gate insulating film) advances.

In the second method for fabricating a semiconductor device according to the present disclosure, at the time when the step (c) is completed, a resistance of each of the side portions of the fin-semiconductor region may be equal to or less than a resistance of the upper portion of the fin-semiconductor region. The arrangement allows a three-dimensional device having more excellent characteristics, such as a FET, to be implemented.

The second method for fabricating a semiconductor device according to the present disclosure may further include, after the step (a) and prior to the step (b), the steps of: (d) forming a gate insulating film on at least each of side surfaces of a predetermined portion of the semiconductor region; and (e) forming a gate electrode on the gate insulating film and, in the step (b), the first impurity may be introduced into the fin-semiconductor region located outside the gate electrode. The arrangement allows a three-dimensional device having more excellent characteristics, such as a FET, to be implemented.

In the second method for fabricating a semiconductor device according to the present disclosure, the first impurity may be boron, phosphorus, or arsenic. The arrangement allows the effects of the present disclosure described above to be reliably obtained.

In the first or second method for fabricating a semiconductor device according to the present disclosure, the fin-semiconductor region may be formed on an insulating layer formed on the substrate. The arrangement allows a three-dimensional device having more excellent characteristics, such as a FET, to be implemented.

In the first or second method for fabricating a semiconductor device according to the present disclosure, the fin-semiconductor region may be made of silicon. The arrangement allows a three-dimensional device having more excellent characteristics, such as a FET, to be implemented.

A first semiconductor device according to the present disclosure includes: a fin-semiconductor region formed on a substrate, wherein a first impurity which produces a donor level or an acceptor level in a semiconductor is introduced in each of an upper portion and side portions of the fin-semiconductor region, and oxygen or nitrogen is further introduced as a second impurity in each of the upper portion and side portions of the fin-semiconductor region.

In the first semiconductor device according to the present disclosure, the first impurity which produces a donor level or an acceptor level in a semiconductor is introduced in the upper portion and side portions of the fin-semiconductor region, and oxygen or nitrogen, i.e., an impurity which changes a semiconductor into an insulator is further introduced as the second impurity in the upper portion and side portions of the fin-semiconductor region. At this time, if a larger amount of the second impurity is introduced in the upper portion of the fin-semiconductor region than in each of the side portions of the fin-semiconductor region, the resistance of the side portion of the fin-semiconductor region can be set equal to or less than the resistance of the upper portion of the fin-semiconductor region. Also, by introducing the second impurity which changes a semiconductor into an insulator, it is sufficient for a process time required to increase the resistance of the upper portion of the fin-semiconductor region to be short. Therefore, it is possible to implement a three-dimensional device having excellent characteristics, such as a FET, with an excellent throughput.

Note that the amount of the second impurity introduced in the side portion of the fin-semiconductor region is of an order that does not affect the respective device characteristics of extension regions and source/drain regions.

As the second impurity which changes a semiconductor into an insulator, oxygen or nitrogen which is introduced into Si and forms an insulator ($SiO_2$ or $SiN_x$) is preferably used if the semiconductor is, e.g., Si. However, it will be appreciated that the second impurity is not limited thereto.

In the first semiconductor device according to the present disclosure, a resistance of each of the side portions of the fin-semiconductor region may be equal to or less than a resistance of the upper portion of the fin-semiconductor region. The arrangement allows a three-dimensional device having more excellent characteristics, such as a FET, to be implemented.

In the first semiconductor device according to the present disclosure, an insulator may be formed in the upper portion of the fin-semiconductor region through introduction of the second impurity therein. In this case, a double-gate FET in which only the both side portions of the fin-semiconductor region function as a channel is formed. However, a triple-gate FET may also be formed by removing an insulator region formed through the introduction of the second impurity, and causing the upper portion of the fin-semiconductor region to function as a channel. That is, by removing the insulator region, a high-concentration first-impurity introduced layer is also removed from the upper portion of the fin-semiconductor region but, if a low-concentration first-impurity introduced layer remains under the insulator region, the triple-gate FET can be formed. Here, the resistance of a first-impurity introduced layer in each of the side portions of the fin-semiconductor region is preferably equal to or less than the resistance of the low-concentration first-impurity introduced layer remaining in the upper portion of the fin-semiconductor region. Also, the low-concentration first-impurity introduced layer remaining in the upper portion of the fin-semiconductor region may also contain the second impurity in an amount that does not affect the respective characteristics of the extension regions and the source/drain regions.

In the first semiconductor device according to the present disclosure, the fin-semiconductor region may be formed on an insulating layer formed on the substrate. The arrangement allows a three-dimensional device having more excellent characteristics, such as a FET, to be implemented.

The first semiconductor device according to the present disclosure may further include: a gate insulating film formed on at least each of side surfaces of a predetermined portion of the fin-semiconductor region; and a gate electrode formed on the gate insulating film, and the first impurity and the second impurity may be introduced in the fin-semiconductor region located outside the gate electrode. The arrangement allows a three-dimensional device having more excellent characteristics, such as a FET, to be implemented. In this case, it is particularly effective if extension regions are formed in the side portions of the fin-semiconductor region located outside the gate electrode through introduction of the first impurity therein. More preferably, the first semiconductor device according to the present disclosure further includes: insulating sidewall spacers formed on side surfaces of the gate electrode, the extension regions are formed in portions of the fin-semiconductor region covered with the insulating sidewall spacers, and source/drain regions are formed in the side portions of the fin-semiconductor region located outside the insulating sidewall spacers through introduction of the first impurity therein.

In the first semiconductor device according to the present disclosure, the fin-semiconductor region may be made of silicon, or the first impurity may be boron, phosphorus, or arsenic. The arrangement allows the effects of the present disclosure described above to be reliably obtained.

Note that, if the second impurity is oxygen or nitrogen in the first semiconductor device according to the present disclosure, the introduction of the second impurity can be performed using an oxygen gas or a nitrogen gas which is inexpensive and safe. This offers cost and process advantages.

A first plasma doping system according to the present disclosure includes: a first plasma doping apparatus for introducing a first impurity which produces a donor level or an acceptor level in a semiconductor into an object to be processed by a plasma doping process; and a second plasma doping apparatus for introducing oxygen or nitrogen as a second impurity into the object to be processed by a plasma doping process.

The first plasma doping system according to the present disclosure allows the first impurity which produces a donor level or an acceptor level in a semiconductor to be introduced into the object to be processed by the plasma doping process, and allows oxygen or nitrogen, i.e., an impurity which changes a semiconductor into an insulator to be introduced as the second impurity into the object to be processed by the plasma doping process. Therefore, it is possible to implement the first method for fabricating a semiconductor device according to the present disclosure.

A second plasma doping system according to the present disclosure includes: a plasma doping apparatus for introducing a first impurity which produces a donor level or an acceptor level in a semiconductor into an object to be processed by a plasma doping process; and an ion implantation apparatus for introducing oxygen or nitrogen as a second impurity into the object to be processed by an ion implantation process.

The second plasma doping system according to the present disclosure allows the first impurity which produces a donor level or an acceptor level in a semiconductor to be introduced into the object to be processed by the plasma doping process, and allows oxygen or nitrogen, i.e., an impurity which changes a semiconductor into an insulator to be introduced as the second impurity into the object to be processed by the ion implantation process. Therefore, it is possible to implement the first method for fabricating a semiconductor device according to the present disclosure.

The first or second plasma doping system according to the present disclosure may further include: a dry etching apparatus for performing dry etching on the object to be processed. With the arrangement, when the first method for fabricating a semiconductor device according to the present disclosure is implemented, it is possible to remove the upper portion of the fin-semiconductor region after the introduction of the first and second impurities.

A third plasma doping system according to the present disclosure includes: a plasma doping apparatus for introducing a first impurity which produces a donor level or an acceptor level in a semiconductor into an object to be processed by a plasma doping process; and a dry etching apparatus for performing dry etching on the object to be processed.

The third plasma doping system according to the present disclosure allows the first impurity which produces a donor level or an acceptor level in a semiconductor to be introduced into the object to be processed by the plasma doping process, and allows the dry etching to be performed on the object to be processed. Therefore, it is possible to implement the second method for fabricating a semiconductor device according to the present disclosure.

A third method for fabricating a semiconductor device according to the present disclosure includes the steps of: (a) forming a fin-semiconductor region on a substrate; and (b) introducing an impurity which produces a donor level or an acceptor level in a semiconductor and oxygen into upper portion and side portions of the fin-semiconductor region by a plasma doping process.

The third method for fabricating a semiconductor device according to the present disclosure allows the same effects as achieved by the first method for fabricating a semiconductor device according to the present disclosure to be obtained.

A second semiconductor device according to the present disclosure includes: a fin-semiconductor region formed on a substrate, wherein an impurity which produces a donor level or an acceptor level in a semiconductor and oxygen are introduced in upper portion and side portions of the fin-semiconductor region.

The second semiconductor device according to the present disclosure allows the same effects as achieved by the first semiconductor device according to the present disclosure to be obtained.

A fourth plasma doping system according to the present disclosure is a plasma doping system for introducing an impurity which produces a donor level or an acceptor level in a semiconductor and oxygen into an object to be processed by a plasma doping process.

The fourth plasma doping system according to the present disclosure allows the same effects as achieved by the first plasma doping system according to the present disclosure to be obtained.

ADVANTAGES OF THE INVENTION

In accordance with the present disclosure, it is possible to obtain desired characteristics by forming low-resistance impurity regions in the side portions of a fin-semiconductor region using a plasma doping process, and reduce a process time till the desired characteristics are obtained.

BRIEF DESCRIPTION OF THE DRAWINGS

FIGS. 1(a)-1(e) are views each showing a structure of a semiconductor device according to the first example embodiment of the present disclosure, specifically the semiconductor device having a fin-FET, of which FIG. 1(a) is a plan view, FIG. 1(b) is a cross-sectional view along the line A-A in FIG. 1(a), FIG. 1(c) is a cross-sectional view along the line B-B in FIG. 1(a), FIG. 1(d) is a cross-sectional view along the line C-C in FIG. 1(a), and FIG. 1(e) is a cross-sectional view along the line D-D in FIG. 1(a).

FIGS. 4(a)-4(c) are views each showing a structure of the semiconductor device according to the second example embodiment of the present disclosure, specifically a semiconductor device having a fin-FET, of which FIG. 4(a) is a cross-sectional view along the line B-B in FIG. 1(a), FIG. 4(b) is a cross-sectional view along the line C-C in FIG. 1(a), and FIG. 4(c) is a cross-sectional view along the line D-D in FIG. 1(a).

FIGS. 11(a)-11(d) are views each showing a structure of a semiconductor device according to another variation of the first example embodiment of the present disclosure, of which FIG. 11(a) is a cross-sectional view along the line A-A in FIG. 1(a), FIG. 11(b) is a cross-sectional view along the line B-B in FIG. 1(a), FIG. 11(c) is a cross-sectional view along the line C-C in FIG. 1(a), and FIG. 11(d) is a cross-sectional view along the line D-D in FIG. 1(a).

FIGS. 12(a)-12(d) are views each showing a structure of a conventional fin-FET, of which FIG. 12(a) is a plan view, FIG. 12(b) is a cross-sectional view along the line A-A in FIG. 12(a), FIG. 12(c) is a cross-sectional view along the line B-B in FIG. 12(a), and FIG. 12(d) is a cross-sectional view along the line C-C in FIG. 12(a).

DESCRIPTION OF EMBODIMENTS

Example Embodiment 1

A semiconductor device according to the first example embodiment of the present disclosure and a method for fabricating the same will be described with reference to the drawings.

Figure 1:
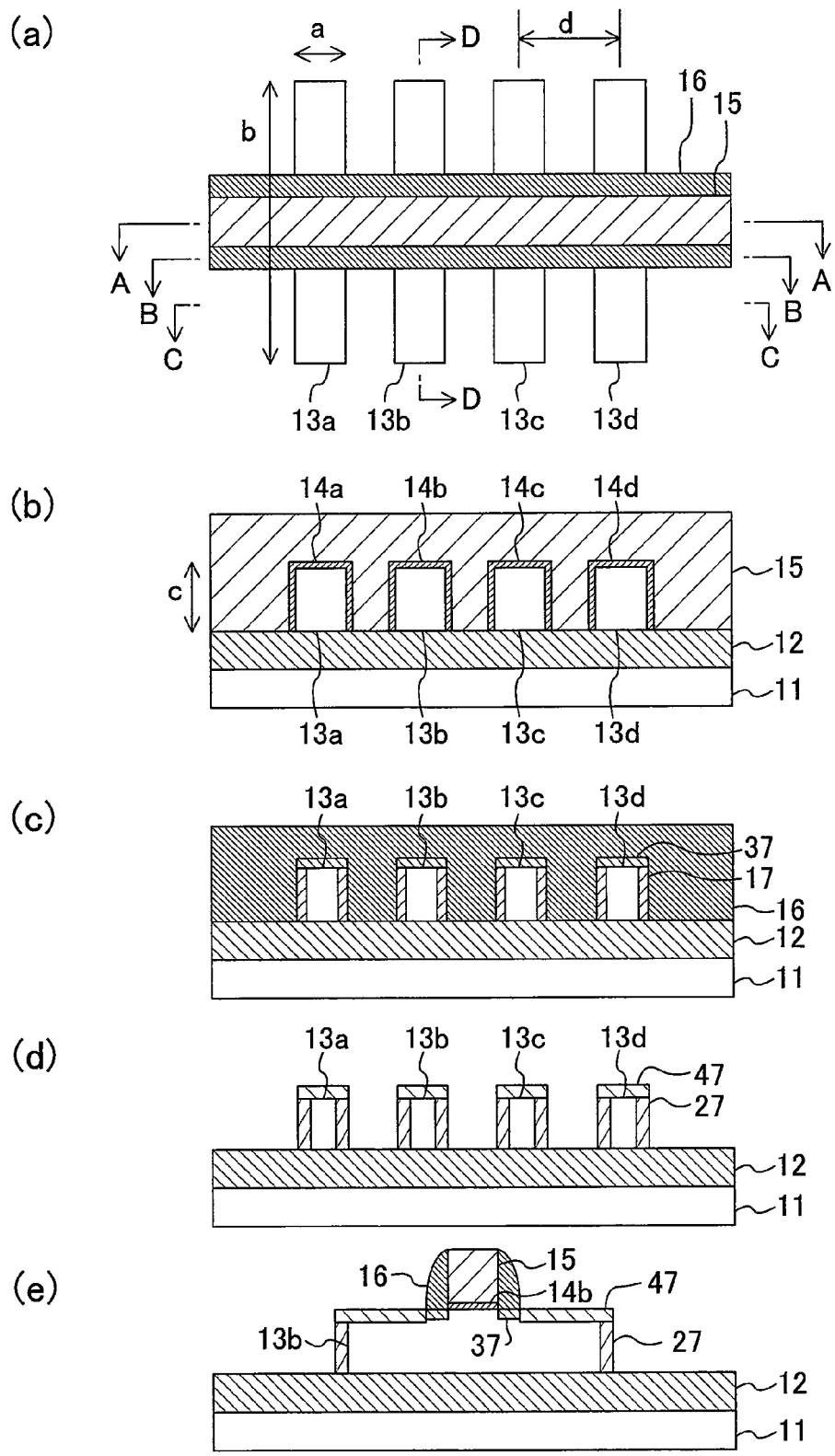

FIGS. 1(a)-1(e) are views each showing a structure of the semiconductor device according to the present example embodiment, specifically the semiconductor device having a fin-FET, of which FIG. 1(a) is a plan view, FIG. 1(b) is a cross-sectional view along the line A-A in FIG. 1(a), FIG. 1(c) is a cross-sectional view along the line B-B in FIG. 1(a), FIG. 1(d) is a cross-sectional view along the line C-C in FIG. 1(a), and FIG. 1(e) is a cross-sectional view along the line D-D in FIG. 1(a).

As shown in FIGS. 1(a)-1(e), the fin-FET according to the present example embodiment has a support substrate 11 made of, e.g., silicon, an insulating layer 12 made of, e.g., silicon dioxide formed on the support substrate 11, fin-semiconductor regions 13a-13d formed on the insulating layer 12 and made of, e.g., silicon, a gate electrode 15 formed over the fin-semiconductor regions 13a-13d with gate insulating films 14a-14d each made of, e.g., a silicon oxynitride film being interposed therebetween, insulating sidewall spacers 16 formed on the side surfaces of the gate electrode 15, extension regions 17 formed in the both side regions of the fin-semiconductor regions 13a-13d with the gate electrode 15 being interposed therebetween, and source/drain regions 27 formed in the both side regions of the fin-semiconductor regions 13a-13d with the gate electrode 15 and the insulating sidewall spacers 16 being interposed therebetween. Each of the fin-semiconductor regions 13a-13d has a width a in a gate width direction of, e.g., about 30 nm, a width b in a gate length direction of, e.g., about 200 nm, and a height (thickness) c of, e.g., about 50 nm. The fin-semiconductor regions 13a-13d are disposed on the insulating layer 12 to be arranged with a pitch d (e.g., about 60 nm) in the gate width direction.

Note that the upper surface and side surfaces of each of the fin-semiconductor regions 13a-13d may be or may not be perpendicular to each other. The gate electrode 15 is formed so as to extend over the fin-semiconductor regions 13a-13d in the gate width direction. The extension regions 17 are formed in the side portions of the fin-semiconductor regions 13a-13d covered with the insulating sidewall spacers 16. The source/drain regions 27 are formed in the side portions of the fin-semiconductor regions 13a-13d located outside the insulating sidewall spacers 16. Note that the description and depiction of pocket regions is omitted.

The present example embodiment has the following features. That is, a first impurity (e.g., boron) which produces a donor level or an acceptor level in a semiconductor is introduced in the upper portion and side portions of each of the fin-semiconductor regions 13a-13d, and a second impurity (e.g., oxygen) which changes a semiconductor into an insulator is further introduced in the upper portion of each of the fin-semiconductor regions 13a-13d. In this manner, the sheet resistance of the side portions of each of the fin-semiconductor regions 13a-13d is set equal to or less than the sheet resistance of the upper portion of each of the fin-semiconductor regions 13a-13d.

Specifically, as shown in FIGS. 1(c) and 1(d), in the upper portions of the fin-semiconductor regions 13a-13d covered with the insulating sidewall spacers 16, insulator regions 37 are formed through the introduction of the second impurity therein and, in the upper portions of the fin-semiconductor regions 13a-13d located outside the insulating sidewall spacers 16, insulator regions 47 are formed through the introduction of the second impurity therein.

Also as shown in FIGS. 1(c) and 1(d), in the sidewall portions of the fin-semiconductor regions 13a-13d covered with the insulating sidewall spacers 16, impurity regions serving as the extension regions 17 are formed through the introduction of the first impurity therein and, in the side portions of the fin-semiconductor regions 13a-13d located outside the insulating sidewall spacers 16, impurity regions serving as the source/drain regions 27 are formed through the introduction of the first impurity therein.

Thus, in the present example embodiment, a double-gate FET is formed in which only the both side portions of the fin-semiconductor regions 13a-13d function as a channel. That is, as the ratio of the height (height (thickness) c of FIG. 1(a)) of each of the fin-semiconductor regions 13a-13d to the width (width a in the gate width direction of FIG. 1(a)) thereof increases, it becomes possible to more positively ensure a sufficient width in the gate width direction for each of the extension regions 17 and the source/drain regions 27. As a result, desired transistor characteristics can be obtained.

Note that the second impurity may also be introduced into the side portions of the fin-semiconductor regions 13a-13d in an amount that does not affect the respective characteristics of the extension regions 17 and the source/drain regions 27.

In the description given above, the sheet resistance of each of the side portions (the extension regions 17 and the source/drain regions 27) of the fin-semiconductor regions 13a-13d is set equal to or less than the sheet resistance of each of the upper portions (the insulator regions 37 and 47) of the fin-semiconductor regions 13a-13d. However, the same effects can be obtained if, instead of this, the specific resistance or spreading resistance of each of the side portions (the extension regions 17 and the source/drain regions 27) of the fin-semiconductor regions 13a-13d is set equal to or less than the specific resistance or spreading resistance of each of the upper portions (the insulator regions 37 and 47) of the fin-semiconductor regions 13a-13d. When it is assumed here that the sheet resistance of a target object is Rs, the resistivity (specific resistance) thereof is $\rho$, the thickness (junction depth) thereof is t, and the spreading resistance thereof is $\rho w$, $Rs=\rho/t$ is satisfied. Because the resistivity (specific resistance) $\rho$ and the spreading resistance $\rho w$ are basically in one-to-one relation, the expression $Rs \propto \rho w/t$ is obtained. A description will be given below primarily using the "sheet resistance" but, with regard to the ordering relations among the resistances, the "sheet resistance" may also be replaced with the "specific resistance" or "spreading resistance."

The method for fabricating the semiconductor device according to the first example embodiment of the present disclosure will be described below with reference to the drawings.

FIGS. 2(a)-2(e) are cross-sectional views showing the method for fabricating the semiconductor device according to the present example embodiment in the order of process steps. Note that FIGS. 2(a)-2(e) correspond to a cross-sectional structure along the line D-D in FIG. 1(a).

Figure 2:
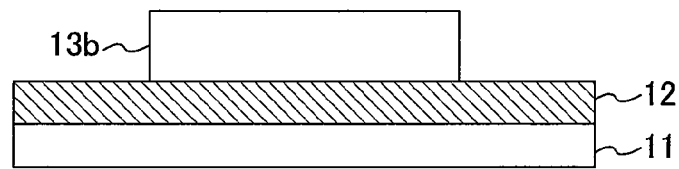
FIGS. 2(a)-2(e) are cross-sectional views showing a method for fabricating the semiconductor device according to the first example embodiment of the present disclosure in the order of process steps.
Figure 2:
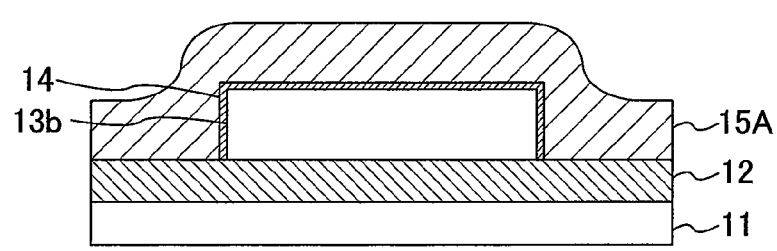
Figure 2:
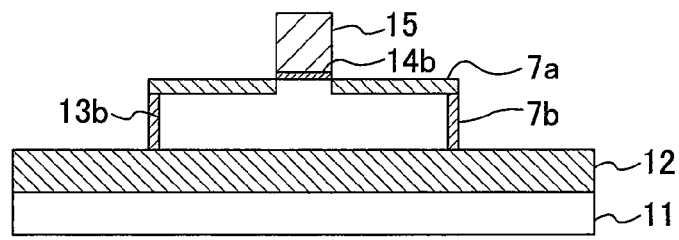
Figure 2:
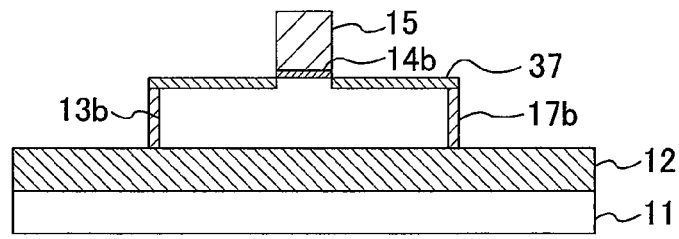
Figure 2:
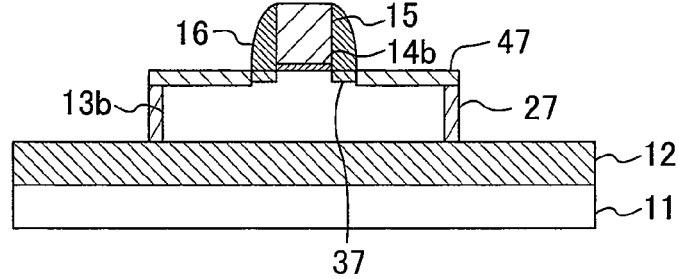

First, as shown in FIG. 2(a), a SOI substrate is prepared in which a semiconductor layer made of, e.g., silicon and having a thickness of 50 nm is provided over the support substrate 11 made of, e.g., silicon and having a thickness of 800 μm with the insulating layer 12 made of, e.g., silicon dioxide and having a thickness of 150 nm being interposed therebetween. Then, the semiconductor layer is patterned to form the n-type fin-semiconductor region 13b serving as an active region. Here, the fin-semiconductor region 13b has the width a in the gate width direction of, e.g., about 30 nm, the width b in the gate length direction of, e.g., about 200 nm, and the height (thickness) c of, e.g., about 50 nm, and is disposed to be aligned with another adjacent fin-semiconductor region with the pitch d (e.g., about 60 nm).

Next, as shown in FIG. 2(b), the gate insulating film 14 made of, e.g., a silicon oxynitride film and having a thickness of 3 nm is formed on the surface of the fin-semiconductor region 13b, and then a polysilicon film 15A having a thickness of, e.g., about 60 nm is formed over the entire surface of the support substrate 11.

Next, as shown in FIG. 2(c), the polysilicon film 15A and the gate insulating film 14 are successively etched to form the gate electrode 15 having a width in the gate length direction of, e.g., 60 nm over the fin-semiconductor region 13b with the gate insulating film 14b being interposed therebetween.

Then, using the gate electrode 15 as a mask, the first impurity (e.g., boron) which produces a donor level or an acceptor level in a semiconductor is introduced into the upper portion and side portions of the fin-semiconductor region 13b by a plasma doping process. As a result, p-type first impurity regions 7a are formed in the upper portion of the fin-semiconductor region 13b, and p-type second impurity regions 7b are formed in the side portions of the fin-semiconductor region 13b.

Figure 14:
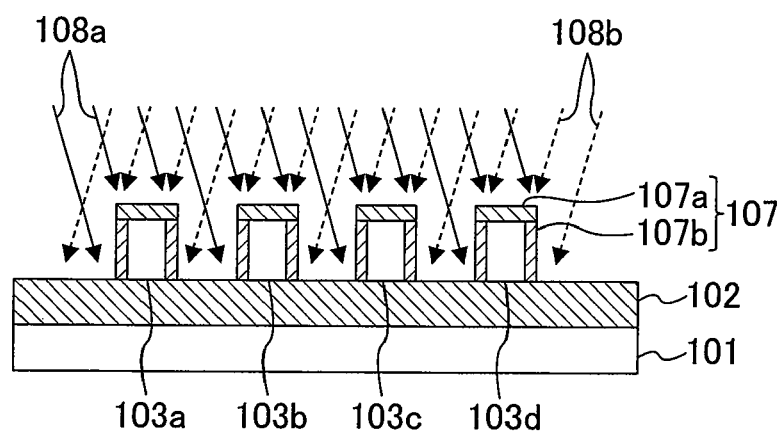
FIG. 14(a) is a cross-sectional view showing the step of forming the extension regions of a fin-FET in Patent Document 1.
FIG. 14(b) is a cross-sectional view showing the step of forming the extension regions of a fin-FET in Non-Patent Document 1.
Figure 14:
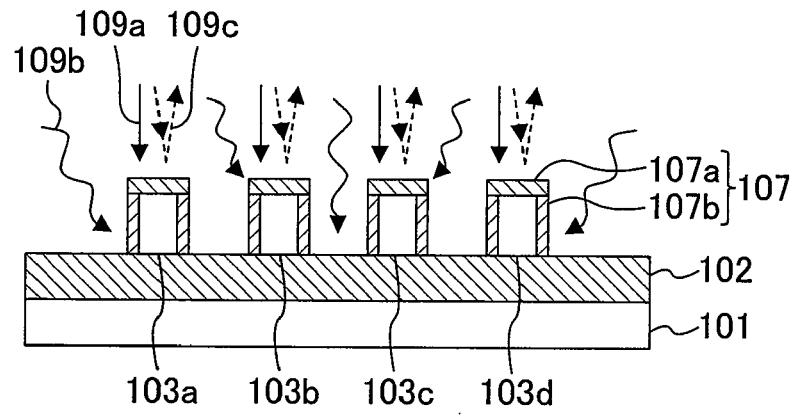

At this time, each of the first impurity regions 7a is formed to have an introduction dosage higher than that in each of the second impurity regions 7b. The reason for this is as follows (see FIG. 14(b) showing a conventional example). When impurity introduction is performed using the plasma doping process, the first impurity regions 107a each having an introduction dosage determined by the balance among introduced ions 109a, adsorbed species (neutral species such as gas molecules and radicals) 109b, and impurities 109c desorbed by sputtering from the fin-semiconductor regions 103a-103d are formed in the upper portions of the fin-semiconductor regions 103a-103d. On the other hand, as for the introduction dosage in each of the side portions of the fin-semiconductor regions 103a-103d, it is less affected by the introduced ions 109a or the impurities 109c desorbed by sputtering so that the second impurity regions 107b each having the introduction dosage primarily determined by the adsorbed species 109b are formed in the side portions of the fin-semiconductor regions 103a-103d. As a result, the introduction dosage in the first impurity region 107a is higher than the introduction dosage in the second impurity region 107b by, e.g., about 25%.

Figure 3:
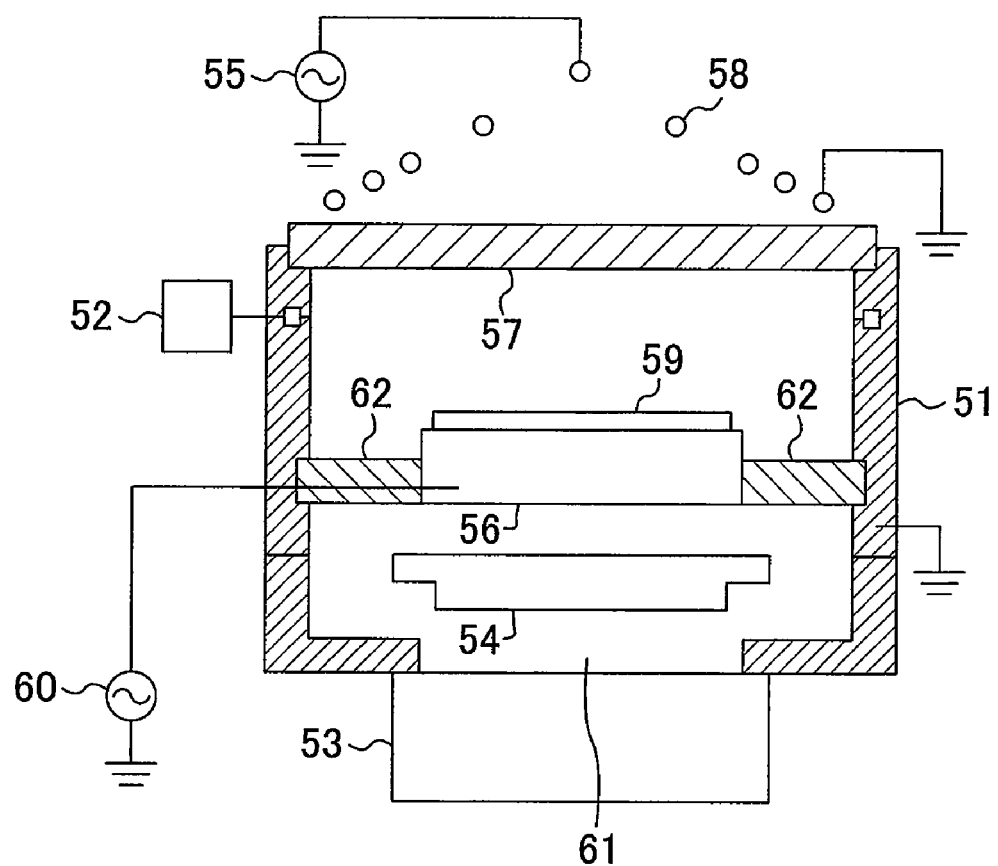
FIG. 3 is a cross-sectional view showing a structure of a plasma doping apparatus or a dry etching apparatus used in each of the methods for fabricating the semiconductor devices according to the first and second example embodiments of the present disclosure.

The plasma doping process for forming the first and second impurity regions 7a and 7b can be performed using, e.g., the plasma doping apparatus shown in FIG. 3. In the plasma doping apparatus shown in FIG. 3, a predetermined gas is introduced from a gas supply device 52 into a vacuum vessel 51, while the gas is exhausted using a turbo molecule pump 53 as a gas exhaust device, to allow a pressure adjustment valve 54 to maintain the inside of the vacuum vessel 51 under a predetermined pressure. By supplying an RF power of, e.g., 13.56 MHz from an RF power source 55 to a coil 58 provided in the vicinity of a dielectric window 57 opposing a sample electrode 56, an inductively coupled plasma can be generated in the vacuum vessel 51. A substrate 59 as a sample is placed on the sample electrode 56. In addition, an RF power source 60 for supplying an RF power to the sample electrode 56 is provided to function as a voltage source which controls the potential of the sample electrode 56 such that the substrate 59 as the sample has a negative potential with respect to the plasma. In this manner, it is possible to amorphize the surface of the sample or introduce an impurity by accelerating ions in the plasma toward the surface of the sample (substrate 59) and causing collision therebetween.

Note that the gas supplied from the gas supply device 52 is exhausted from an exhaust hole 61 to the turbo molecule pump 53. The turbo molecule pump 53 and the exhaust hole 61 are disposed immediately under the sample electrode 56, and the pressure adjustment valve 54 is an elevator valve located immediately under the sample electrode 56 and immediately over the turbo molecule pump 53. The sample electrode 56 is fixed to the vacuum vessel 51 by four support rods 62 (of which the two support rods 62 are depicted).

Plasma doping conditions for forming the first and second impurity regions 7a and 7b are such that, e.g., a raw material gas is $B_2H_6$ (diborane) diluted with He (helium), the concentration of diborane in the raw material gas is 0.05 mass percent, a total flow rate of the raw material gas is 420 cc/minute (standard state), an in-chamber pressure is 0.9 Pa, an RF power supplied to the coil is 2000 W, an RF power supplied to the sample electrode is 135 W, and a substrate temperature is 20° C.

Next, using the gate electrode 15 as a mask, the second impurity (e.g., oxygen) which changes a semiconductor into an insulator is introduced into the upper portion of the fin-semiconductor region 13b by a plasma doping process. As a result, as shown in FIG. 2(d), the insulator regions 37 are formed in the upper portion of the fin-semiconductor region 13b. At this time, the second impurity may also be introduced into the side portions of the fin-semiconductor region 13b in an amount which does not degrade the respective characteristics of the extension regions and the source/drain regions. In that case, the p-type second impurity regions 7b formed in the side portions of the fin-semiconductor region 13b in the step shown in FIG. 2(c) are modified into p-type second impurity regions 17b. The p-type second impurity regions 17b serve as the extension regions 17 (see FIG. 1(c)) in the side portions of the fin-semiconductor region 13b covered with the insulating sidewall spacers 16 (see FIG. 2(e)).

In the present example embodiment, the sheet resistance of each of the second impurity regions 17b forming the extension regions 17 can be set lower than the sheet resistance of each of the insulator regions 37 in the upper portion of the fin-semiconductor region 13b. That is, the sheet resistance, specific resistance, or spreading resistance of the second impurity region 17b can be set lower than the sheet resistance, specific resistance, or spreading resistance of the insulator region 37. Accordingly, as the ratio of the height (height (thickness) c of FIG. 1(a)) of the fin-semiconductor region 13b to the width (width a in the gate width direction of FIG. 1(a)) thereof increases, it becomes possible to more positively ensure a sufficient width in the gate width direction for each of the extension regions 17, and therefore obtain desired transistor characteristics.

Here, for the plasma doping with oxygen as the second impurity which changes a semiconductor into an insulator, the plasma doping apparatus shown in FIG. 3 described above, e.g., can be used. Plasma doping conditions used at that time are such that, e.g., a raw material gas is $O_2$ (oxygen), a flow rate of the raw material gas is 50 cc/minute (standard state), an in-chamber pressure is 0.5 Pa, an RW power supplied to the coil is 2000 W, an RF power supplied to the sample electrode is 800 W, and a substrate temperature is 20° C. In the case of thus performing doping with oxygen by supplying the relatively high RF power to the sample electrode, the doping results in anisotropic doping which selectively advances in a direction perpendicular to the principal surface of the substrate. As a result, the second impurity regions 17b in the side portions of the fin-semiconductor region 13b are scarcely doped with oxygen.

Note that the dosage of oxygen is set such that the atomic density of oxygen in the range (from the upper surface of the substrate to a depth of about several nanometers therefrom) where the insulator regions 37 are formed is about not less than the atomic density (about $5.0 \times 10^{22}/cm^3$) of silicon and about not more than double the atomic density of silicon.

As a typical plasma process using oxygen as a reactive species, an ashing process is well known. In contrast to the case of the ashing process where an oxidation (ashing) reaction isotropically occurs, high bias plasma doping according to the present example embodiment can cause anisotropic doping.

In the present example embodiment, plasma doping with oxygen as the second impurity may also be performed using a microwave plasma source with a magnetic field, and using a gas mixture of Ar (argon) and $O_2$ as a raw material gas (see, e.g., Japanese Laid-Open Patent Publication No. H11-219950).

Next, using the gate electrode 15 as a mask, impurity ions are implanted into the fin-semiconductor region 13b to form n-type pocket regions, although the depiction thereof is omitted.

Next, as shown in FIG. 2(e), an insulating film having a thickness of, e.g., 60 nm is formed over the entire surface of the support substrate 11, and then etched back using anisotropic dry etching to form the insulating sidewall spacers 16 on the side surfaces of the gate electrode 15.

Then, in the same manner as in the plasma doping process for forming the first and second impurity regions 7a and 7b, using the gate electrode 15 and the insulating sidewall spacers 16 as a mask, the first impurity (e.g., boron) which produces a donor level or an acceptor level in a semiconductor is introduced into the upper portion and side portions of the fin-semiconductor region 13b by a plasma doping process. Subsequently, in the same manner as in the plasma doping process for forming the insulator regions 37, using the gate electrode 15 and the insulating sidewall spacers 16 as a mask, the second impurity (e.g., oxygen) which changes a semiconductor into an insulator is introduced into the upper portion of the fin-semiconductor region 13b by a plasma doping process. As a result, as shown in FIG. 2(d), the insulator regions 47 are formed in the upper portion of the fin-semiconductor region 13b located outside the insulating sidewall spacers 16, and p-type impurity regions serving as the source/drain regions 27 are formed in the side portions of the fin-semiconductor region 13b located outside the insulating sidewall spacers 16.

In the present example embodiment, the sheet resistance of each of the source/drain regions 27 can be set lower than the sheet resistance of each of the insulator regions 47 in the upper portion of the fin-semiconductor region 13b. That is, the sheet resistance, specific resistance, or spreading resistance of each of the source/drain regions 27 can be set lower than the sheet resistance, specific resistance, or spreading resistance of each of the insulator regions 47. Accordingly, as the ratio of the height (height (thickness) c of FIG. 1(a)) of the fin-semiconductor region 13b to the width (width a in the gate width direction of FIG. 1(a)) thereof increases, it becomes possible to more positively ensure a sufficient width in the gate width direction for each of the source/drain regions 27, and therefore obtain desired transistor characteristics.

The present example embodiment has the following features. That is, when the extension regions 17 of the fin-FET are formed using the plasma doping process, the first impurity (e.g., boron) which produces a donor level or an acceptor level in a semiconductor is introduced into the upper portion and side portions of the fin-semiconductor region 13b by the plasma doping process, and then the second impurity (e.g., oxygen) which changes a semiconductor into an insulator is introduced into the upper portion of the fin-semiconductor region 13b by the plasma doping process. In this manner, a fin-MISFET can be obtained in which the second impurity regions 17b (extension regions 17) each having the sheet resistance, specific resistance, or spreading resistance lower than that of each of the insulator regions 37 in the upper portion of the fin-semiconductor region 13b are provided in the side portions of the fin-semiconductor region 13b. Accordingly, as the ratio of the height (height (thickness) c of FIG. 1(a)) of the fin-semiconductor region 13b to the width (width a in the gate width direction of FIG. 1(a)) thereof increases, it becomes possible to more positively ensure a sufficient width in the gate width direction for each of the extension regions 17, and therefore obtain desired transistor characteristics.

Moreover, since a typical plasma doping process can be used in each of the steps of introducing the first impurity and the second impurity when the extension regions 17 are formed, the introduction of each of the impurities can be completed in an extremely short period of time (e.g., about 10 to 120 seconds). As a result, the total process time can be significantly reduced compared with the conventional total process time.

Additionally, in the same manner as in the case of the extension regions 17, when the source/drain regions 27 of the fin-FET are formed using the plasma doping process, the first impurity (e.g., boron) which produces a donor level or an acceptor level in a semiconductor is introduced into the upper portion and side portions of the fin-semiconductor region 13b by the plasma doping process, and then the second impurity (e.g., oxygen) which changes a semiconductor into an insulator is introduced into the upper portion of the fin-semiconductor region 13b by the plasma doping process. In this manner, the fin-MISFET can be obtained in which the source/drain regions 27 each having the sheet resistance, specific resistance, or spreading resistance lower than that of each of the insulator regions 47 in the upper portion of the fin-semiconductor region 13b are provided in the side portions of the fin-semiconductor region 13b. Accordingly, as the ratio of the height (height (thickness) c of FIG. 1(a)) of the fin-semiconductor region 13b to the width (width a in the gate width direction of FIG. 1(a)) thereof increases, it becomes possible to more positively ensure a sufficient width in the gate width direction for each of the source/drain regions 27, and therefore obtain desired transistor characteristics.

Moreover, since a typical plasma doping process can be used in each of the steps of introducing the first impurity and the second impurity when the source/drain regions 27 are formed, the introduction of each of the impurities can be completed in an extremely short period of time (e.g., about 10 to 120 seconds). As a result, the total process time can be significantly reduced compared with the conventional total process time.

Note that, in the present example embodiment, the exemplary case has been shown where the p-type extension regions 17 and the p-type source/drain regions 27 are formed, i.e., the p-type MISFET is formed by plasma doping the n-type fin-semiconductor region 13b with a p-type impurity. However, instead of these, n-type extension regions and n-type source/drain regions, i.e., an n-type MISFET may also be formed by doping a p-type fin-semiconductor region with an n-type impurity.

Also in the present example embodiment, when each of the extension regions 17 and the source/drain regions 27 is formed, the plasma doping with the first impurity is performed first, and then the plasma doping with the second impurity is performed. Instead, however, it is also possible that the plasma doping with the second impurity may be performed first, and then the plasma doping with the first impurity may be performed.

In the present example embodiment, the plasma doping with the second impurity may also be omitted when the source/drain regions 27 are formed. In this case, the second impurity may also be preliminarily introduced in a sufficient dosage into the upper portion of the fin-semiconductor region 13b in the plasma doping with the second impurity when the extension regions 17 are formed.

Example Embodiment 2

A semiconductor device according to the second example embodiment of the present disclosure and a method for fabricating the same will be described with reference to the drawings.

Figure 4:
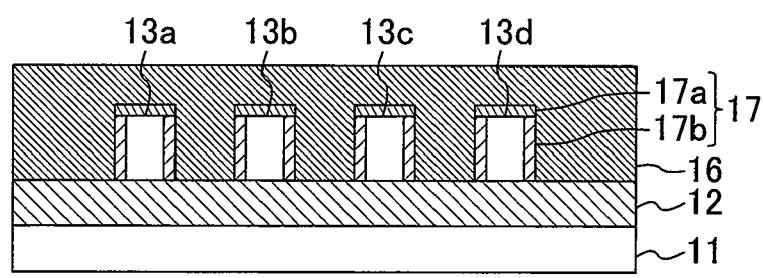
Figure 4:
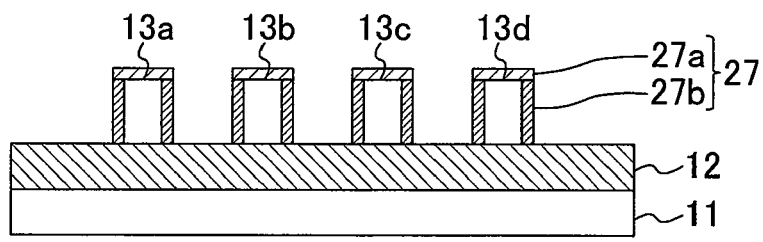
Figure 4:
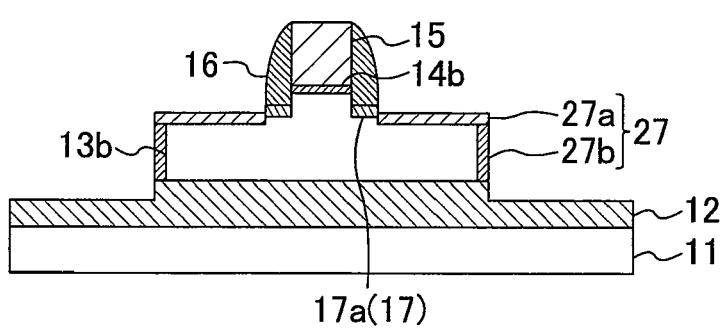

The semiconductor device according to the present example embodiment, specifically the semiconductor device having a fin-FET has the same two-dimensional structure as the two-dimensional structure of the semiconductor device according to the first example embodiment shown in FIG. 1(a). FIGS. 4(a)-4(c) are views each showing a structure of the semiconductor device according to the present example embodiment, specifically the semiconductor device having the fin-FET, of which FIG. 4(a) is a cross-sectional view along the line B-B in FIG. 1(a), FIG. 4(b) is a cross-sectional view along the line C-C in FIG. 1(a), and FIG. 4(c) is a cross-sectional view along the line D-D in FIG. 1(a). Note that, in the present example embodiment, the cross-sectional structure along the line A-A in FIG. 1(a) is the same as the cross-sectional structure of the semiconductor device according to the first example embodiment shown in FIG. 1(b).

As shown in FIGS. 1(a), 1(b), and 4(a)-4(c), the fin-FET according to the present example embodiment has the support substrate 11 made of, e.g., silicon, the insulating layer 12 made of, e.g., silicon dioxide formed on the support substrate 11, the fin-semiconductor regions 13a-13d formed on the insulating layer 12, the gate electrode 15 formed over the fin-semiconductor regions 13a-13d with the gate insulating films 14a-14d each made of, e.g., a silicon oxynitride film being interposed therebetween, the insulating sidewall spacers 16 formed on the side surfaces of the gate electrode 15, the extension regions 17 formed in the both side regions of the fin-semiconductor regions 13a-13d with the gate electrode 15 being interposed therebetween, and the source/drain regions 27 formed in the both side regions of the fin-semiconductor regions 13a-13d with the gate electrode 15 and the insulating sidewall spacers 16 being interposed therebetween. Each of the fin-semiconductor regions 13a-13d has the width a in the gate width direction of, e.g., about 30 nm, the width b in the gate length direction of, e.g., about 200 nm, and the height (thickness) c of, e.g., about 50 nm. The fin-semiconductor regions 13a-13d are disposed on the insulating layer 12 to be arranged in the gate width direction with the pitch d (e.g., about 60 nm).

Note that the upper surface and side surfaces of each of the fin-semiconductor regions 13a-13d may be or may not be perpendicular to each other. The gate electrode 15 is formed so as to extend over the fin-semiconductor regions 13a-13d in the gate width direction. Each of the extension regions 17 includes a first impurity region 17a formed in the upper portion of each of the fin-semiconductor regions 13a-13d and the second impurity regions 17b formed in the side portions of each of the fin-semiconductor regions 13a-13d. On the other hand, each of the source/drain regions 27 includes a third impurity region 27a formed in the upper portion of each of the fin-semiconductor regions 13a-13d and fourth impurity regions 27b formed in the side portions of each of the fin-semiconductor regions 13a-13d. Note that the description and depiction of pocket regions is omitted.

In the present example embodiment, a triple-gate FET is formed in which the upper portion and both side portions of each of the fin-semiconductor regions 13a-13d function as a channel. The present example embodiment has the following features. That is, the introduction dosage in each of the second impurity regions 17b formed in the side portions of each of the fin-semiconductor regions is set equal to or more than the introduction dosage in each of the first impurity regions 17a formed in the upper portion of each of the fin-semiconductor regions. This allows the sheet resistance of the second impurity region 17b forming each of the extension regions 17 to be set equal to or less than the sheet resistance of the first impurity region 17a. As a result, even when the ratio of the width of each of the second impurity regions 17b formed in the side portions of the fin-semiconductor regions to the width of each of the extension regions 17 in the gate width direction increases, desired transistor characteristics can be obtained. Likewise, the introduction dosage in each of the fourth impurity regions 27b formed in the side portions of each of the fin-semiconductor regions is set equal to or more than the impurity dosage in each of the third impurity regions 27a formed in the upper portion of each of the fin-semiconductor regions. This allows the sheet resistance of the fourth impurity region 27b forming each of the source/drain regions 27 to be set equal to or less than the sheet resistance of the third impurity region 27a. As a result, even when the ratio of the width of each of the fourth impurity regions 27b formed in the side portions of the fin-semiconductor regions to the width of each of the source/drain regions 27 in the gate width direction increases, desired transistor characteristics can be obtained.

In the foregoing description, the sheet resistance of the second impurity region 17b (fourth impurity region 27b) is set equal to or less than the sheet resistance of the first impurity region 17a (third impurity region 27a). However, the same effects can be obtained if the specific resistance or spreading resistance of the second impurity region 17b (fourth impurity region 27b) is set equal to or less than the specific resistance or spreading resistance of the first impurity region 17a (third impurity region 27a). When it is assumed here that the sheet resistance of a target object is Rs, the resistivity (specific resistance) thereof is $\rho$, the thickness (junction depth) thereof is t, and the spreading resistance thereof is $\rho w$, Rs=$\rho$/t is satisfied. Since the resistivity (specific resistance) $\rho$ and the spreading resistance $\rho w$ are basically in one-to-one relation, the expression Rs$\propto \rho w$/t is obtained. A description will be given below primarily using the "sheet resistance" but, with regard to the ordering relations among the resistances, the "sheet resistance" may also be replaced with the "specific resistance" or "spreading resistance."

Note that, as long as the implantation dosage in each of the second impurity regions 17b formed in the side portions of the fin-semiconductor region is about 80% (more preferably 90%) or more of the implantation dosage in each of the first impurity regions 17a formed in the upper portion of the fin-semiconductor region, the transistor characteristics can be significantly improved compared with those obtained with the prior art technology. Likewise, as long as the implantation dosage in each of the fourth impurity regions 27b formed in the side portions of the fin-semiconductor region is about 80% (more preferably 90%) or more of the implantation dosage in each of the third impurity regions 27a formed in the upper portion of the fin-semiconductor region, the transistor characteristics can be significantly improved compared with those obtained with the prior art technology.

In the present example embodiment, when a "Height of Side Surface of Fin-Semiconductor Region"/"Width of Upper Surface of Fin-Semiconductor Region in Gate Width Direction" ratio (hereinafter referred to as the aspect ratio) is low, even if the implantation dosage in the second impurity region 17b is lower to a degree than the implantation dosage in the first impurity region 17a, i.e., even if the sheet resistance, specific resistance, or spreading resistance of the second impurity region 17b is higher to a degree (e.g., by about 10% or less) than the sheet resistance, specific resistance, or spreading resistance of the first impurity region 17a, the degradation of the transistor characteristics is small. On the other hand, as the aspect ratio increases, the need to set the implantation dosage in the second impurity region 17b equal to or more than the implantation dosage in the first impurity region 17a, i.e., the need to set the sheet resistance, specific resistance, or spreading resistance of the second impurity region 17b equal to or less than the sheet resistance, specific resistance, or spreading resistance of the first impurity region 17a increases. Likewise, when the aspect ratio is low, even if the implantation dosage in the fourth impurity region 27b is lower to a degree than the implantation dosage in the third impurity region 27a, i.e., even if the sheet resistance, specific resistance, or spreading resistance of the fourth impurity region 27b is higher to a degree (e.g., by about 10% or less) than the sheet resistance, specific resistance, or spreading resistance of the third impurity region 27a, the degradation of the transistor characteristics is small. On the other hand, as the aspect ratio increases, the need to set the implantation dosage in the fourth impurity region 27b equal to or more than the implantation dosage in the third impurity region 27a, i.e., the need to set the sheet resistance, specific resistance, or spreading resistance of the fourth impurity region 27b equal to or less than the sheet resistance, specific resistance, or spreading resistance of the third impurity region 27a increases.

The method for fabricating the semiconductor device according to the second example embodiment of the present disclosure will be described below with reference to the drawings.

FIGS. 5(a)-5(g) are cross-sectional views showing the method for fabricating the semiconductor device according to the present example embodiment in the order of process steps. Note that FIGS. 5(a)-5(g) correspond to a cross-sectional structure along the line D-D in FIG. 1(a).

Figure 5:
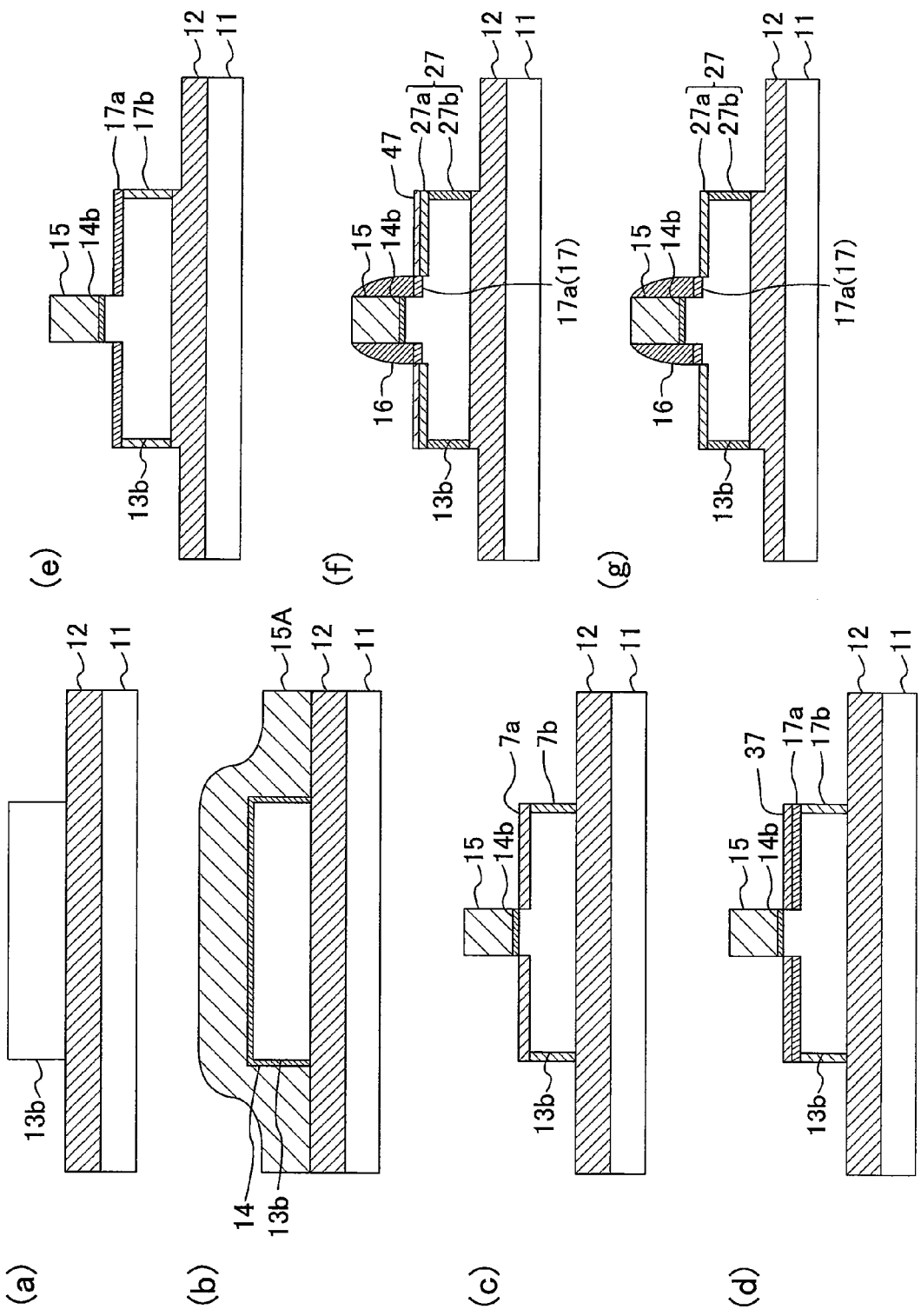
FIGS. 5(a)-5(g) are cross-sectional views showing the method for fabricating the semiconductor device according to the second example embodiment of the present disclosure in the order of process steps.

First, as shown in FIG. 5(a), a SOI substrate is prepared in which a semiconductor layer made of, e.g., silicon and having a thickness of 50 nm is provided over the support substrate 11 made of, e.g., silicon and having a thickness of 800 μm with the insulating layer 12 made of, e.g., silicon dioxide and having a thickness of 150 nm being interposed therebetween. Then, the semiconductor layer is patterned to form the p-type fin-semiconductor region 13b serving as an active region. Here, the fin-semiconductor region 13b has the width a in the gate width direction of, e.g., about 30 nm, the width b in the gate length direction of, e.g., about 200 nm, and the height (thickness) c of, e.g., about 50 nm, and is disposed to be aligned with another adjacent fin-semiconductor region with the pitch d (e.g., about 60 nm).

Next, as shown in FIG. 5(b), the gate insulating film 14 made of, e.g., a silicon oxynitride film and having a thickness of 3 nm is formed on the surface of the fin-semiconductor region 13b, and then a polysilicon film 15A having a thickness of, e.g., about 60 nm is formed over the entire surface of the support substrate 11.

Next, as shown in FIG. 5(c), the polysilicon film 15A and the gate insulating film 14 are successively etched to form the gate electrode 15 having a width in the gate length direction of, e.g., 60 nm over the fin-semiconductor region 13b with the gate insulating film 14b being interposed therebetween.

Then, using the gate electrode 15 as a mask, the first impurity (e.g., arsenic) which produces a donor level or an acceptor level in a semiconductor is introduced into the upper portion and side portions of the fin-semiconductor region 13b by a plasma doping process. As a result, the n-type first impurity regions 7a are formed in the upper portion of the fin-semiconductor region 13b, and the n-type second impurity regions 7b are formed in the side portions of the fin-semiconductor region 13b.

At this time, each of the first impurity regions 7a is formed to have an introduction dosage higher than that in each of the second impurity regions 7b. The reason for this is as follows (see FIG. 14(b) showing a conventional example). When impurity introduction is performed using the plasma doping process, the first impurity regions 107a each having the introduction dosage determined by the balance among the introduced ions 109a, the adsorbed species (neutral species such as gas molecules and radicals) 109b, and the impurities 109c desorbed by sputtering from the fin-semiconductor regions 103a-103d are formed in the upper portions of the fin-semiconductor regions 103a-103d. On the other hand, as for the introduction dosage in each of the side portions of the fin-semiconductor regions 103a-103d, it is less affected by the introduced ions 109a or the impurities 109c desorbed by sputtering so that the second impurity regions 107b each having the introduction dosage primarily determined by the adsorbed species 109b are formed in the side portions of the fin-semiconductor regions 103a-103d. As a result, the introduction dosage in the first impurity region 107a is higher than the introduction dosage in the second impurity region 107b by, e.g., about 25%.

The plasma doping process for forming the first and second impurity regions 7a and 7b can be performed using, e.g., the plasma doping apparatus shown in FIG. 3. At this time, plasma doping conditions for forming the first and second impurity regions 7a and 7b are such that, e.g., a raw material gas is $AsH_4$ (arsine) diluted with He (helium), the concentration of arsine in the raw material gas is 0.3 mass percent, a total flow rate of the raw material gas is 300 cc/minute (standard state), an in-chamber pressure is 0.9 Pa, an RW power supplied to the coil is 2000 W, an RF power supplied to a sample electrode is 200 W, and a substrate temperature is 20° C.

Next, using the gate electrode 15 as a mask, the second impurity (e.g., oxygen) which changes a semiconductor into an insulator is introduced into the upper portion of the fin-semiconductor region 13b by a plasma doping process. As a result, as shown in FIG. 5(d), the insulator regions 37 are formed in the surface portions of the first impurity regions 7a formed in the upper portion of the fin-semiconductor region 13b, and the n-type first impurity regions 17a (residues of the first impurity regions 7a) remain under the insulator regions 37. At this time, each of the first impurity regions 17a may also contain the second impurity in an amount that does not degrade the respective characteristics of the extension regions and the source/drain regions. The second impurity may also be introduced into the side portions of the fin-semiconductor region 13b in an amount that does not degrade the respective characteristics of the extension regions and the source/drain regions. In that case, the n-type second impurity regions 7b formed in the side portions of the fin-semiconductor region 13b in the step shown in FIG. 5(c) are modified into the n-type second impurity regions 17b. The first impurity regions 17a and the second impurity regions 17b serve as the extension regions 17 (see FIG. 4(a)) in the fin-semiconductor region 13b covered with the insulating sidewall spacers 16 (see FIG. 5(f)).

In the present example embodiment, the high-concentration first-impurity introduced portions of the first impurity regions 7a become the insulator regions 37, and the remaining first impurity regions 7a become the first impurity regions 17a. Therefore, the sheet resistance of each of the second impurity regions 17b in the side portions of the fin-semiconductor region 13b can be reduced to be lower than the sheet resistance of each of the first impurity regions 17a in the upper portion of the fin-semiconductor region 13b. That is, the sheet resistance, specific resistance, or spreading resistance of the second impurity region 17b can be reduced to be lower than the sheet resistance, specific resistance, or spreading resistance of the first impurity region 17a. Accordingly, as the ratio of the height (height (thickness) c of FIG. 1(a)) of the fin-semiconductor region 13b to the width (width a in the gate width direction of FIG. 1(a)) thereof increases, it becomes possible to more positively ensure a sufficient width in the gate width direction for each of the extension regions 17, and therefore obtain desired transistor characteristics.

Here, for the plasma doping with oxygen as the second impurity which changes a semiconductor into an insulator, the plasma doping apparatus shown in FIG. 3 described above, e.g., can be used. Plasma doping conditions used at that time are such that, e.g., a raw material gas is $O_2$ (oxygen), a flow rate of the raw material gas is 50 cc/minute (standard state), an in-chamber pressure is 0.5 Pa, an RW power supplied to the coil is 2000 W, an RF power supplied to the sample electrode is 800 W, and a substrate temperature is 20° C. In the case of thus performing doping with oxygen by supplying the relatively high RF power to the sample electrode, the doping results in anisotropic doping which selectively advances in a direction perpendicular to the principal surface of the substrate. As a result, the second impurity regions 17b in the side portions of the fin-semiconductor region 13b are scarcely doped with oxygen.

Note that the dosage of oxygen is set such that the atomic density of oxygen in the range (from the upper surface of the substrate to a depth of about several nanometers therefrom) where the insulator regions 37 are formed is about not less than the atomic density (about $5.0 \times 10^{22}/cm^3$) of silicon and about not more than double the atomic density of silicon.

As a typical plasma process using oxygen as a reactive species, an ashing process is well known. In contrast to the case of the ashing process in which an oxidation (ashing) reaction isotropically occurs, high bias plasma doping according to the present example embodiment can cause anisotropic doping.

In the present example embodiment, plasma doping with oxygen as the second impurity may also be performed using a microwave plasma source with a magnetic field, and using a gas mixture of Ar (argon) and $O_2$ as a raw material gas (see, e.g., Japanese Laid-Open Patent Publication No. HEI 11-219950).

Next, as shown in FIG. 5(e), the insulator regions 37 formed in the upper portion of the fin-semiconductor region 13b are removed. As a method for removing the insulator regions 37, dry etching using a plasma made of a gas mixture of, e.g., Ar and $CF_4$ can be used. At this time, the exposed surface of the insulating layer 12 made of silicon dioxide is also etched, although slightly.

Here, for the dry etching process performed on the insulator regions 37, a dry etching apparatus having the same structure as that of, e.g., the plasma doping apparatus shown in FIG. 3 can be used. In that case, dry etching conditions are such that, e.g., a raw material gas is $CF_4$ (tetrafluoromethane) diluted with argon (Ar), the concentration of tetrafluoromethane in the raw material gas is 5 mass percent, a total flow rate of the raw material gas is 200 cc/minute (standard state), an in-chamber pressure is 1.3 Pa, an RW power supplied to the coil is 1500 W, an RF power supplied to a sample electrode is 100 W, and a substrate temperature is 20° C. In the case of thus performing dry etching by supplying the RF power to the sample electrode, the dry etching results in anisotropic etching which selectively advances only in a direction perpendicular to the principal surface of the substrate. As a result, the second impurity regions 17b in the side portions of the fin-semiconductor region 13b are scarcely etched.

Next, using the gate electrode 15 as a mask, impurity ions are implanted into the fin-semiconductor region 13b to form n-type pocket regions, although the depiction thereof is omitted.

As described above, in the present example embodiment, the n-type first impurity regions 17a formed in the upper portion of the fin-semiconductor region 13b and the n-type second impurity regions 17b formed in the side portions of the fin-semiconductor region 13b form the n-type extension regions 17. Specifically, the first impurity regions 7a formed in the step shown in FIG. 5(c) are modified into the upper-layer insulator regions 37 and the lower-level first impurity regions 17a in the step shown in FIG. 5(d), and the insulator regions 37 are removed in the step shown in FIG. 5(e). At this time, the areas of the first impurity regions 17a formed in the step shown in FIG. 5(c) that are heavily doped with As are selectively removed so that the As concentration in each of the first impurity regions 17a which remain in the step shown in FIG. 5(e) is low. As a result, it is possible to set the sheet resistance of each of the second impurity regions 17b forming the extension regions 17 equal to or less than the sheet resistance of each of the first impurity regions 17a. That is, it is possible to set the sheet resistance, specific resistance, or spreading resistance of the second impurity region 17b equal to or less than the sheet resistance, specific resistance, or spreading resistance of the first impurity region 17a. Therefore, even when the ratio of the width of each of the second impurity regions 17b formed in the side portions of the fin-semiconductor region 13b to the width of each of the extension regions 17 in the gate width direction increases, desired transistor characteristics can be obtained.

Next, as shown in FIG. 5(f), an insulating film having a thickness of, e.g., 60 nm is formed over the entire surface of the support substrate 11, and then etched back using anisotropic dry etching to form the insulating sidewall spacers 16 on the side surfaces of the gate electrode 15.

Thereafter, in the same manner as in the plasma doping process for forming the first and second impurity regions 7a and 7b, using the gate electrode 15 and the insulating sidewall spacers 16 as a mask, the first impurity (e.g., arsenic) which produces a donor level or an acceptor level in a semiconductor is introduced into the upper portion and side portions of the fin-semiconductor region 13b by a plasma doping process. Subsequently, in the same manner as in the plasma doping process for forming the insulator regions 37, using the gate electrode 15 and the insulating sidewall spacers 16 as a mask, the second impurity (e.g., oxygen) which changes a semiconductor into an insulator is introduced into the upper portion of the fin-semiconductor region 13b by a plasma doping process. As a result, as shown in FIG. 5(f), the n-type third impurity regions 27a are formed in the upper portion of the fin-semiconductor region 13b located outside the insulating side wall spacers 16, and the surface portions thereof are modified into the insulator regions 47. On the other hand, the n-type fourth impurity regions 27b are formed in the side portions of the fin-semiconductor region 13b located outside the insulating sidewall spacers 16. The third impurity regions 27a and the fourth impurity regions 27b form the source/drain regions 27. Note that each of the third and fourth impurity regions 27a and 27b may also contain the second impurity in an amount that does not degrade the characteristics of the source/drain regions 27.

Next, as shown in FIG. 5(g), the insulator regions 47 formed in the upper portion of the fin-semiconductor region 13b are removed. As a method for removing the insulator regions 47, dry etching using a plasma made of a gas mixture of, e.g., Ar and $CF_4$ can be used. At this time, the exposed surface of the insulating layer 12 made of silicon dioxide is also etched, although slightly.

As described above, in the present example embodiment, the n-type third impurity regions 27a formed in the upper portion of the fin-semiconductor region 13b and the n-type fourth impurity regions 27b formed in the side portions of the fin-semiconductor region 13b form the n-type source/drain regions 27. Specifically, in the step shown in FIG. 5(f), the third impurity regions 27a are formed, and the surface portions thereof are modified into the insulator regions 47 and, in the step shown in FIG. 5(g), the insulator regions 47 are removed. At this time, the areas of the third impurity regions 27a formed in the step shown in FIG. 5(f) that are heavily doped with As are selectively removed so that the As concentration in each of the third impurity regions 27a which remain in the step shown in FIG. 5(g) is low. As a result, it is possible to set the sheet resistance of each of the fourth impurity regions 27b forming the source/drain regions 27 equal to or less than the sheet resistance of each of the third impurity regions 27a. That is, it is possible to set the sheet resistance, specific resistance, or spreading resistance of the fourth impurity region 27b equal to or less than the sheet resistance, specific resistance, or spreading resistance of the third impurity region 27a. Therefore, even when the ratio of the width of each of the fourth impurity regions 27b formed in the side portions of the fin-semiconductor region 13b to the width of each of the source/drain regions 27 in the gate width direction increases, desired transistor characteristics can be obtained.

The present example embodiment has the following features. That is, when the extension regions 17 of the fin-FET are formed using a plasma doping process, the first impurity (e.g., arsenic) which produces a donor level or an acceptor level in a semiconductor is introduced into the upper portion and side portions of the fin-semiconductor region 13b by a plasma doping process, and then the second impurity (e.g., oxygen) which changes a semiconductor into an insulator is introduced into the upper portion of the fin-semiconductor region 13b by a plasma doping process. In this manner, the surface portions of the first impurity regions 17a formed in the upper portion of the fin-semiconductor region 13b are modified into the insulator regions 37, and then the insulator regions 37 are removed. As a result, a fin-MISFET (triple-gate FET in which the upper portion and both side portions of the fin-semiconductor region 13b function as a channel) can be obtained which includes the extension regions 17 including the first impurity regions 17a remaining in the upper portion of the fin-semiconductor region 13b and the second impurity regions 17b each having the sheet resistance, specific resistance, or spreading resistance equal to or less than that of the first impurity region 17a. Accordingly, as the ratio of the height (height (thickness) c of FIG. 1(a)) of the fin-semiconductor region 13b to the width (width a in the gate width direction of FIG. 1(a)) thereof increases, it becomes possible to more positively ensure a sufficient width in the gate width direction for each of the extension regions 17, and therefore obtain desired transistor characteristics.

In addition, since a typical plasma doping process can be used in each of the steps of introducing the first impurity and the second impurity when the extension regions 17 are formed, the introduction of each of the impurities can be completed in an extremely short period of time (e.g., about 10 to 120 seconds). Moreover, since the step of removing the insulator regions 37 is a typical etching step, the step can be completed in an extremely short period of time (e.g., about 5 to 30 seconds). Therefore, the total process time can be significantly reduced compared with the conventional total process time.

When the source/drain regions 27 of the fin-FET are formed using a plasma doping process, the first impurity (e.g., arsenic) which produces a donor level or an acceptor level in a semiconductor is introduced into the upper portion and side portions of the fin-semiconductor region 13*b* by a plasma doping process, and then the second impurity (such as, e.g., oxygen) which changes a semiconductor into an insulator is introduced into the upper portion of the fin-semiconductor region 13*b* by a plasma doping process, in the same manner as in the case of the extension regions 17. In this manner, the surface portions of the third impurity regions 27*a* formed in the upper portion of the fin-semiconductor region 13*b* are modified into the insulator regions 47, and then the insulator regions 47 are removed. As a result, the fin-MISFET (triple-gate FET in which the upper portion and both side portions of the fin-semiconductor region 13*b* function as a channel) can be obtained which includes the source/drain regions 27 including the third impurity regions 27*a* remaining in the upper portion of the fin-semiconductor region 13*b* and the fourth impurity regions 27*b* each having the sheet resistance, specific resistance, or spreading resistance equal to or less than that of the third impurity region 27*a*. Accordingly, as the ratio of the height (height (thickness) c of FIG. 1(*a*)) of the fin-semiconductor region 13*b* to the width (width a in the gate width direction of FIG. 1(*a*)) thereof increases, it becomes possible to more positively ensure a sufficient width in the gate width direction for each of the source/drain regions 27, and therefore obtain desired transistor characteristics.

In addition, since a typical plasma doping process can be used in each of the steps of introducing the first impurity and the second impurity when the source/drain regions 27 are formed, the introduction of each of the impurities can be completed in an extremely short period of time (e.g., about 10 to 120 seconds). Moreover, since the step of removing the insulator regions 47 is a typical etching step, the step can be completed in an extremely short period of time (e.g., about 5 to 30 seconds). Therefore, the total process time can be significantly reduced compared with the conventional total process time.

Note that, in the present example embodiment, the exemplary case has been shown where the n-type extension regions 17 and the n-type source/drain regions 27 are formed, i.e., the n-type MISFET is formed by plasma doping the p-type fin-semiconductor region 13*b* with an n-type impurity. However, instead of these, p-type extension regions and p-type source/drain regions, i.e., a p-type MISFET may also be formed by doping an n-type fin-semiconductor region with a p-type impurity.

Also in the present example embodiment, when each of the extension regions 17 and the source/drain regions 27 is formed, the plasma doping with the first impurity is performed first, and then the plasma doping with the second impurity is performed. Instead, however, it is also possible that the plasma doping with the second impurity may be performed first, and then the plasma doping with the first impurity may be performed.

In the present example embodiment, the plasma doping with the second impurity (i.e., the formation of the insulator regions 47) may also be omitted when the source/drain regions 27 are formed. It will be appreciated that, in this case, the step of removing the insulator regions 47 is also unnecessary.

Also in the present example embodiment, as the method for removing the insulator regions 37 and 47 formed in the upper portion of the fin-semiconductor region 13*b*, the exemplary case has been shown which uses dry etching using a plasma made of the gas mixture of Ar and $CF_4$. However, instead of this, anisotropic etching by dry etching (sputter etching) using a plasma made of an inert gas such as Ar may also be performed. Otherwise, the insulator regions 37 and 47 may also be removed by wet etching by, e.g., dipping the support substrate 11 in a hydrofluoric acid solution. In this case, an etching reaction has isotropy, but the second impurity (oxygen) which changes a semiconductor into an insulator has not been introduced into the second and fourth impurity regions 17*b* and 27*b*. As a result, etching of the second and fourth impurity regions 17*b* and 27*b* does not advance.

Figure 6:
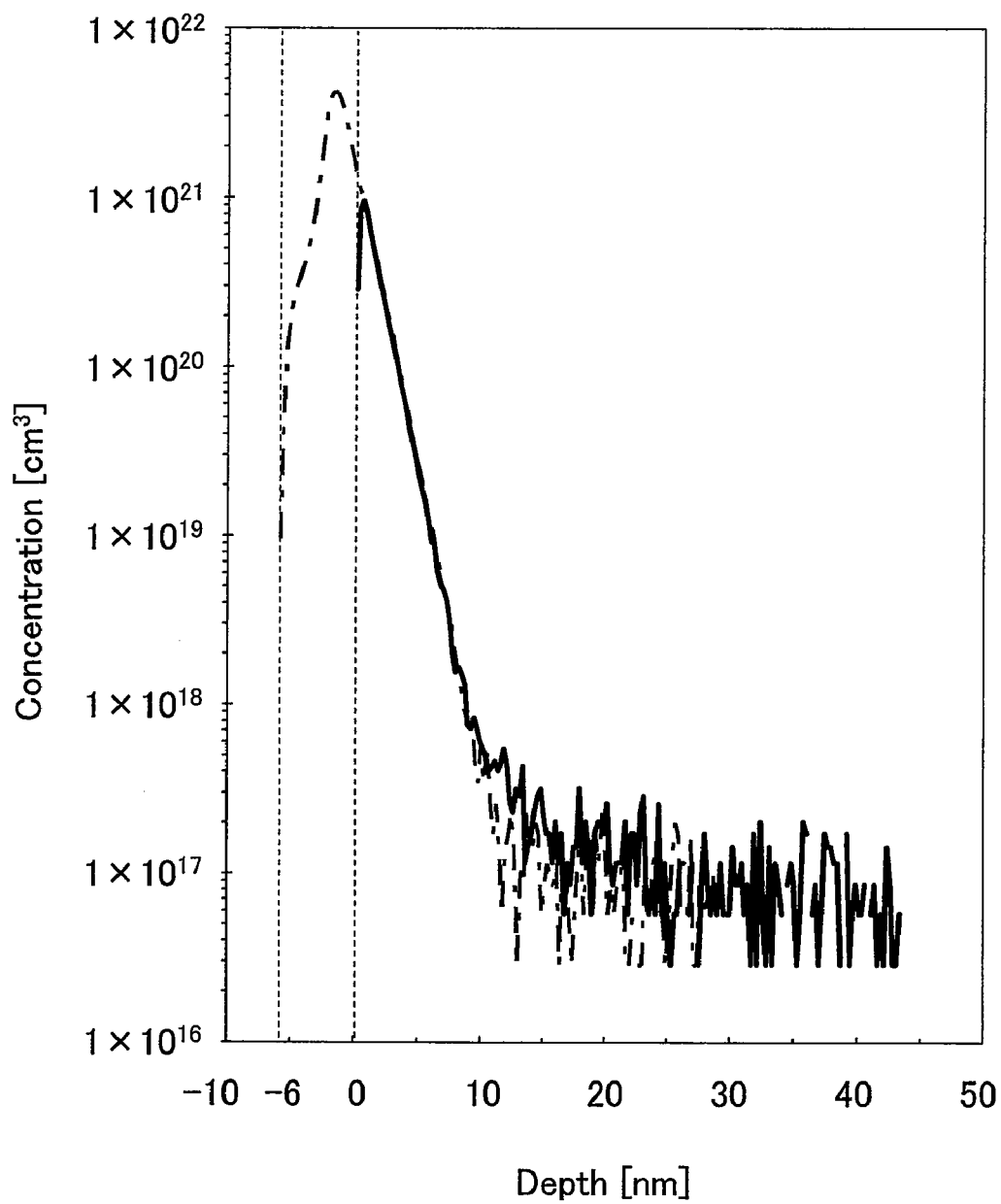
FIG. 6 is a view showing an As concentration profile (dot-dash line) in a silicon substrate into which As (arsenic) and O (oxygen) have been introduced each by plasma doping and an As concentration profile (solid line) in the silicon substrate after an insulator region formed through the introduction of oxygen (O) is removed in the method for fabricating the semiconductor device according to the second example embodiment of the present disclosure.

FIG. 6 shows an As concentration profile (dot-dash line) in a silicon substrate into which As (arsenic) and O (oxygen) have been introduced each by plasma doping and an As concentration profile (solid line) in the silicon substrate after the insulator regions formed through the introduction of O (oxygen) are removed. Here, a depth of 0 nm on the abscissa corresponds to the surface of the silicon substrate after the insulator regions are removed. That is, FIG. 6 shows the case where the insulator regions each having a thickness of 6 nm are formed, but it will be appreciated that this case is only illustrative. Note that the removal of the insulator regions is performed by wet etching, and the measurement of the As concentration is performed by SIMS (Secondary Ion Mass Spectrometry). As shown in FIG. 6, prior to wet etching, As has been introduced at a high concentration into the portion of the silicon substrate from the outermost surface (corresponding to a depth of −6 nm on the abscissa) thereof to a depth of about 6 nm. However, as a result of the removal of the portion by wet etching, the introduction dosage of As is significantly reduced in the surface portion of the silicon substrate after wet etching.

That is, in the case of using dry etching for the removal of the insulator regions 37 and 47, an advantage is obtained that a situation where lateral etching of a gate insulating film (etching from the side surfaces of the gate insulating film) advances can be avoided. On the other hand, in the case of using wet etching, the following advantage is obtained. That is, since an etching selectivity between silicon dioxide (or a silicon nitride) forming the insulator regions 37 and 47 and silicon forming the fin-semiconductor region 13*b* significantly increases as compared to that in the case of dry etching, only the portions where the second impurity which changes a semiconductor into an insulator has been introduced in large amounts can be precisely removed irrespective of an etching time.

In the first and second example embodiments, the exemplary case has been shown in which $B_2H_6$ diluted with He or $AsH_4$ diluted with He is used as the raw material gas in the plasma doping with the first impurity which produces a donor level or an acceptor level in a semiconductor. However, the raw material gas is not limited thereto, and a gas mixture obtained by diluting a raw material gas containing the impurity (hereinafter referred to as an impurity raw material gas) with an inert gas can be used. Specifically, as the impurity raw material gas, $B_xH_y$, $As_xH_y$, $P_xH_y$ (where each of x and y is a natural number), or the like can be used. These gases are advantageous in that, besides B, As, and P, only H which is less influential even when mixed as an impurity in a substrate is contained therein. However, it is also possible to use another gas containing B such as, e.g., $BF_3$, $BCl_3$, or $BBr_3$, and use another gas containing P such as, e.g., $PF_3$, $PF_5$, $PCl_3$, $PCl_5$, or $POCl_3$. As an inert gas for dilution, He, Ne, Ar, Kr, Xe, or the like can be used, but He is most appropriate. The main reason for that is a low sputtering property. An inert gas preferred second to He is Ne. Ne has a drawback of a sputter rate slightly higher than that of He, but has an advantage of a low voltage which allows easy discharging.

Note that, in the case of using $B_2H_6$ diluted with He as the raw material gas in the plasma doping with the first impurity which produces a donor level or an acceptor level in a semiconductor as used in the first example embodiment, the mass concentration of $B_2H_6$ in the raw material gas is preferably not less than 0.01% and not more than 1%. The arrangement allows easy introduction of boron into the fin-semiconductor region. Conversely, when the concentration of a $B_2H_6$ gas is less than 0.01%, it is difficult to introduce a sufficient amount of boron and, when the concentration of the $B_2H_6$ gas is more than 1%, a deposit containing boron tends to easily adhere to the surface of the substrate. It will be appreciated that plasma doping may also be performed using a solid impurity source without using the impurity raw material gas.

In each of the first and second example embodiments, the exemplary method has been shown in which the second impurity which changes a semiconductor into an insulator is introduced into the upper portion of the fin-semiconductor region by the plasma doping process. Instead, however, the second impurity may also be introduced into the upper portion of the fin-semiconductor region by an ion implantation process. When the ion implantation process is used, a process having anisotropy stronger than that of the plasma doping process can be performed. As a result, it is possible to change only the upper portion of the fin-semiconductor region into an insulator without even slightly changing the side portions of the fin-semiconductor region into an insulator.

Also in each of the first and second example embodiments, the exemplary case has been shown where oxygen is used as the second impurity which changes a semiconductor into an insulator. However, instead of this, nitrogen may also be used. Silicon nitride obtained by introducing nitrogen into silicon is an insulator similarly to silicon dioxide, which can be selectively removed by anisotropic dry etching and has a high etching selectivity to silicon in wet etching using, e.g., a hydrofluoric acid solution similarly to silicon dioxide. It will be appreciated that the second impurity is not limited to oxygen or nitrogen but, when the second impurity is oxygen or nitrogen, it offers cost and process advantages since the introduction of the second impurity can be performed using an oxygen gas or a nitrogen gas which is inexpensive and safe.

In the second example embodiment, the exemplary method has been shown in which, after the first impurity which produces a donor level or an acceptor level in a semiconductor is introduced into the upper portion and side portions of the fin-semiconductor region, the second impurity which changes a semiconductor into an insulator is introduced into the upper portion of the fin-semiconductor region to form the insulator regions, and then the insulator regions are removed. However, instead of this, it is also possible that, after the first impurity is introduced into the upper portion and side portions of the fin-semiconductor region, the upper portion of the fin-semiconductor region into which the first impurity has been introduced may be removed using an anisotropic removing reaction such as dry etching without performing the introduction of the second impurity. This allows the high-concentration first-impurity introduced layers to be removed from the upper portion of the fin-semiconductor region, and then allows the low-concentration first-impurity introduced layers to remain therein. Therefore, it is possible to implement a fin-FET including the extension regions and the source/drain regions in each of which the sheet resistance, specific resistance, or spreading resistance of each of the impurity regions formed in the side portions of the fin-semiconductor region is equal to or less than the sheet resistance, specific resistance, or spreading resistance of each of the impurity regions formed in the upper portion of the fin-semiconductor region (after the removing step).

Figure 7:
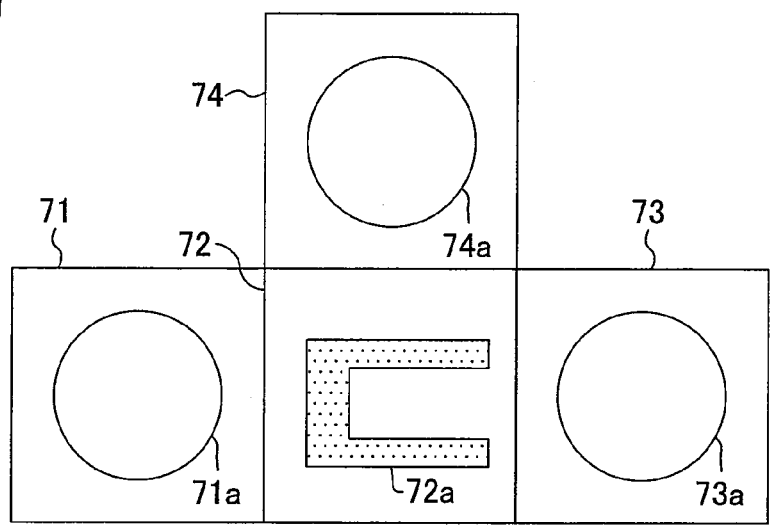
FIG. 7 is a plan view showing an example of a structure of a plasma doping system used in each of the methods for fabricating the semiconductor devices according to the first and second example embodiments of the present disclosure.

In the first and second example embodiments, the plasma doping apparatus (first plasma doping apparatus) used for the plasma doping with the first impurity which produces a donor level or an acceptor level in a semiconductor and the plasma doping apparatus (second plasma doping apparatus) used for the plasma doping with the second impurity which changes a semiconductor into an insulator may have the same structure as that of, e.g., the plasma doping apparatus shown in FIG. 3. However, it is preferred that the first plasma doping apparatus and the second plasma doping apparatus have different vacuum chambers (vacuum vessels) as respective specific entities thereof. This is because the arrangement allows the avoidance of the possibility that a reaction product formed when an organic material (such as a resist) on the substrate is etched by an oxygen plasma may remain in the vacuum vessel, and cause undesirable contamination. Such a structure can be implemented by, e.g., the plasma doping system shown in FIG. 7. As shown in FIG. 7, a substrate loaded in the vacuum vessel 71a of a load-lock chamber 71 is moved into a transfer chamber 72 by a transfer arm 72a, and then moved into the vacuum vessel 73a of a first plasma doping apparatus 73 where the first impurity which produces a donor level or an acceptor level in a semiconductor is introduced into the substrate. Subsequently, the substrate is moved again into the transfer chamber 72 by the transfer arm 72a, and then moved into the vacuum vessel 74a of a second plasma doping apparatus 74 where the second impurity which changes a semiconductor into an insulator is introduced into the substrate. Thereafter, the substrate is moved again into the transfer chamber 72 by the transfer arm 72a, then moved into the vacuum vessel 71a of the load-lock chamber 71, and retrieved.

Figure 8:
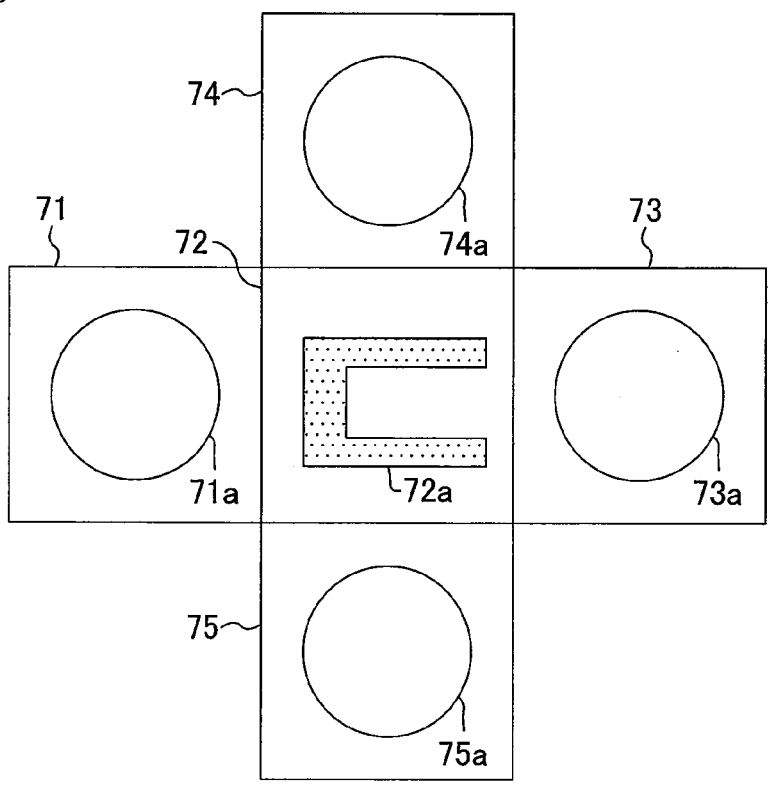
FIG. 8 is a plan view showing an example of the structure of the plasma doping system used in the method for fabricating the semiconductor device according to the second example embodiment of the present disclosure.

Likewise, it is also preferred in the second example embodiment that the vacuum chamber (vacuum vessel) of the dry etching apparatus as a specific entity thereof is different from the vacuum vessels of the first and second plasma doping apparatus as the respective specific entities thereof. This is because the arrangement allows the avoidance of the probability that a reaction product formed when an organic material (such as a resist) on the substrate is etched by a plasma for etching or a halogen element such as fluorine may remain in the vacuum vessel, and cause undesirable contamination. Such a structure can be implemented by, e.g., the plasma doping system shown in FIG. 8. As shown in FIG. 8, a substrate loaded in the vacuum vessel 71a of the load-lock chamber 71 is moved into the transfer chamber 72 by the transfer arm 72a, and then moved into the vacuum vessel 73a of the first plasma doping apparatus 73 where the first impurity which produces a donor level or an acceptor level in a semiconductor is introduced into the substrate. Subsequently, the substrate is moved again into the transfer chamber 72 by the transfer arm 72a, and then moved into the vacuum vessel 74a of the second plasma doping apparatus 74 where the second impurity which changes a semiconductor into an insulator is introduced into the substrate. Then, the substrate is moved again into the transfer chamber 72 by the transfer arm 72a, and then moved into the vacuum vessel 75a of a dry etching apparatus 75 where the insulator regions formed in the upper portion of the fin-semiconductor region are removed by a dry etching process. Thereafter, the substrate is moved again into the transfer chamber 72 by the transfer arm 72a, then moved into the vacuum vessel 71a of the load-lock chamber 71, and retrieved.

It will be appreciated that, in each of the plasma doping systems shown in FIGS. 7 and 8, instead of the second plasma doping apparatus 74 used for the introduction of the second impurity which changes a semiconductor into an insulator, an ion implantation apparatus used for the introduction of the second impurity which changes a semiconductor into an insulator may also be provided.

Figure 9:
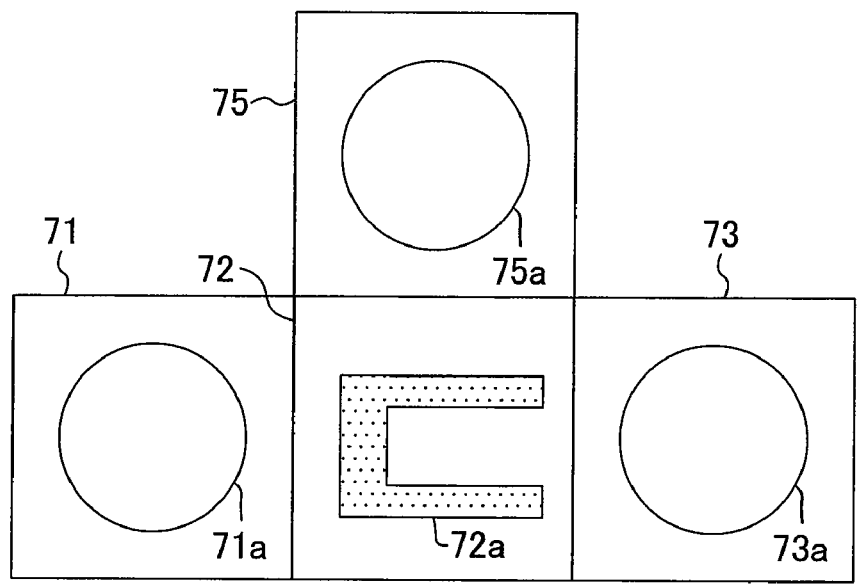
FIG. 9 is a plan view showing an example of a structure of a plasma doping system used in a method for fabricating a semiconductor device according to a variation of the second example embodiment of the present disclosure.

In the second example embodiment, in the case where the first impurity which produces a donor level or an acceptor level in a semiconductor is introduced into the upper portion and side portions of the fin-semiconductor region, and then the upper portion of the fin-semiconductor region in which the first impurity has been introduced is removed using an anisotropic removing reaction such as dry etching without introducing the second impurity which changes a semiconductor into an insulator into the upper portion of the fin-semiconductor region, the use of, e.g., the plasma doping system shown in FIG. 9 is preferred. As shown in FIG. 9, the substrate loaded in the vacuum vessel 71a of the load-lock chamber 71 is moved into the transfer chamber 72 by the transfer arm 72a, and then moved into the vacuum vessel 73a of the first plasma doping apparatus 73 where the first impurity which produces a donor level or an acceptor level in a semiconductor is introduced into the substrate. Subsequently, the substrate is moved again into the transfer chamber 72 by the transfer arm 72a, and then moved into the vacuum vessel 75a of the dry etching apparatus 75 where the insulator regions formed in the upper portion of the fin-semiconductor region are removed by a dry etching process. Thereafter, the substrate is moved again into the transfer chamber 72 by the transfer arm 72a, then moved into the vacuum vessel 71a of the load-lock chamber 71, and retrieved.

To the first and second example embodiments, various modifications can be made.

Figure 10:
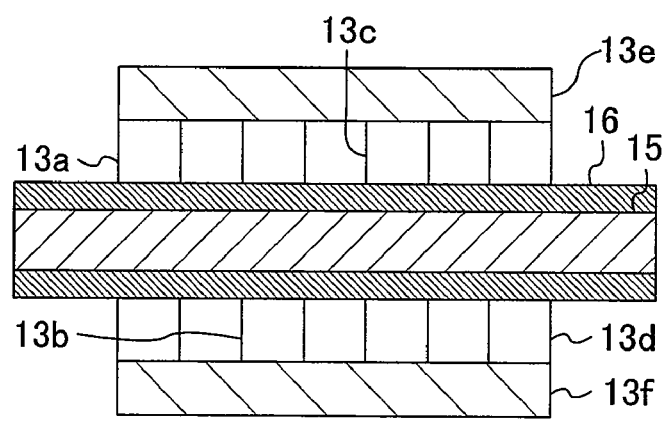
FIG. 10 is a plan of a semiconductor device according to a variation of the first example embodiment of the present disclosure.

FIG. 10 is a plan view of a semiconductor device according to a variation of the first example embodiment of the present disclosure, specifically a semiconductor device having a fin-FET. In FIG. 10, the same components as those of the structure of the first example embodiment shown in FIGS. 1(a)-1(e) are provided with the same reference characters, and an overlapping description is omitted. As shown in FIG. 10, the present variation is different from the first example embodiment shown in FIGS. 1(a)-1(e) in that the both end portions of the fin-semiconductor regions 13a-13d in the gate length direction are connected by other fin-semiconductor regions 13e and 13f. According to the present variation, the same effects as obtained in the first example embodiment can be obtained, and one fin-FET can be formed from the fin-semiconductor regions 13a-13f. It will be appreciated that a similar modification can be made to the second example embodiment.

Figure 11:
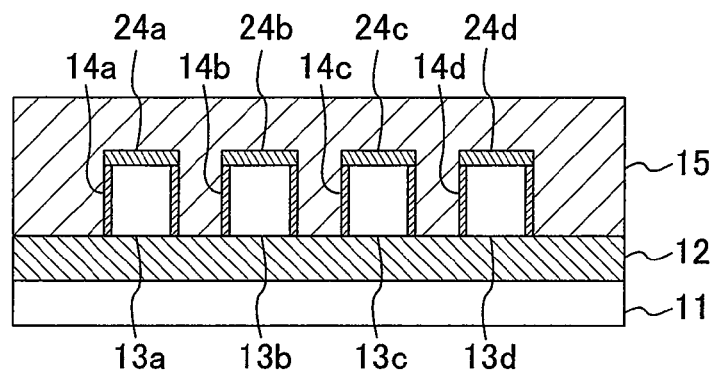
Figure 11:
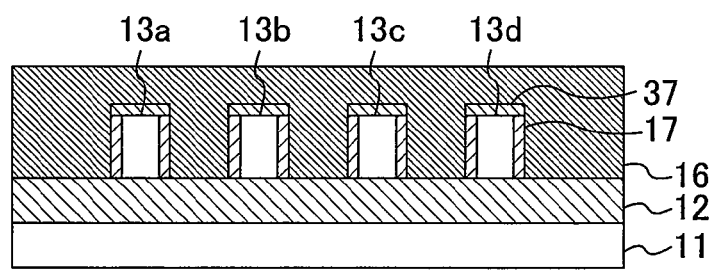
Figure 11:
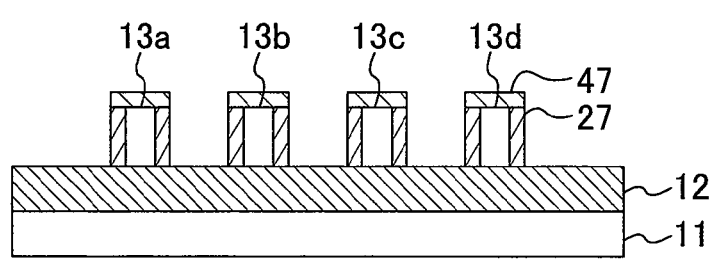
Figure 11:
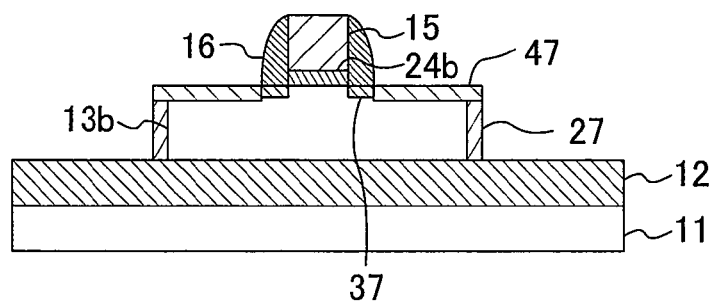
Figure 12:
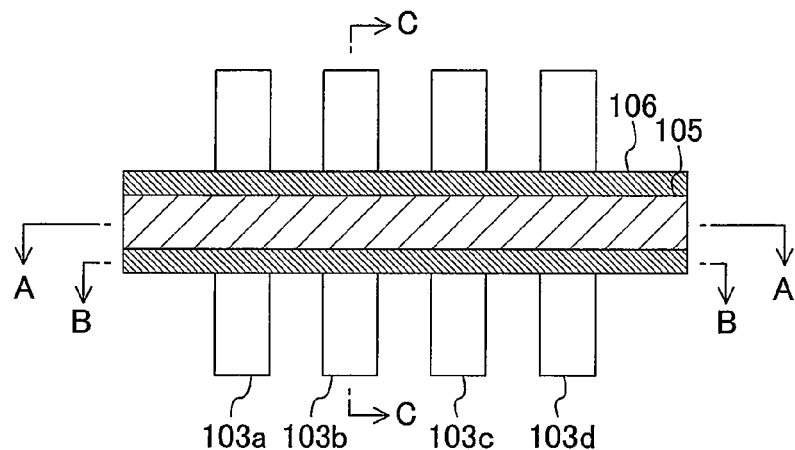
Figure 12:
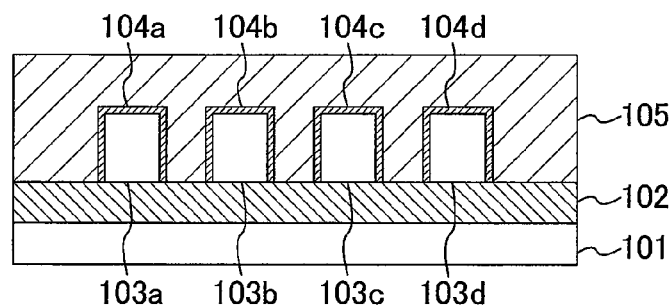
Figure 12:
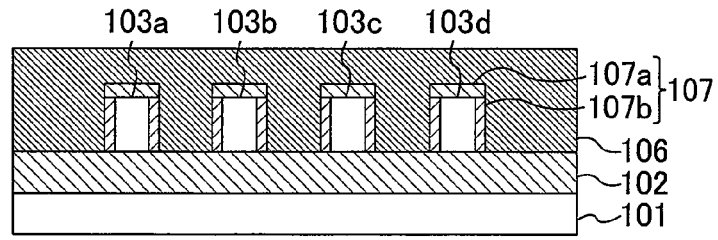
Figure 12:
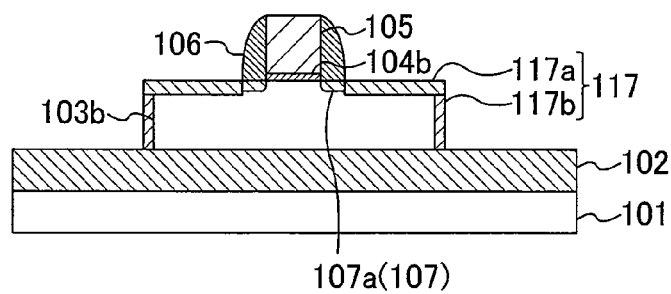
Figure 13:
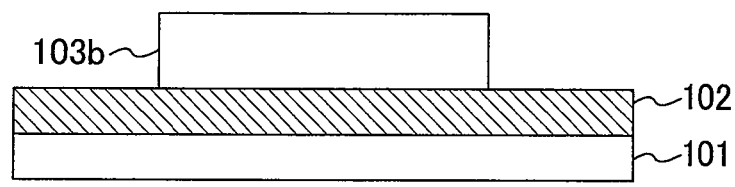
FIGS. 13(a)-13(d) are cross-sectional views showing a method for fabricating the conventional semiconductor device in the order of process steps.
Figure 13:
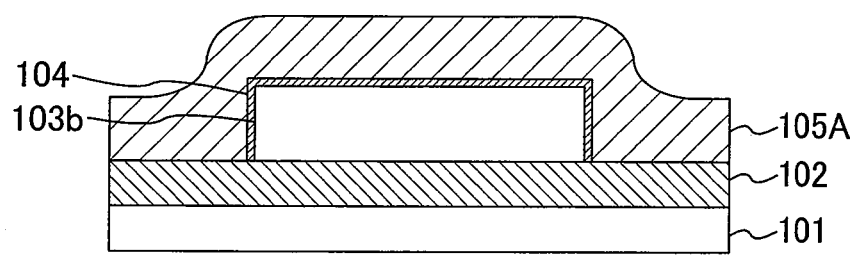
Figure 13:
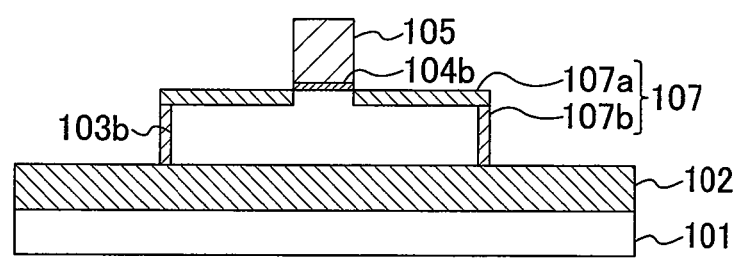
Figure 13:
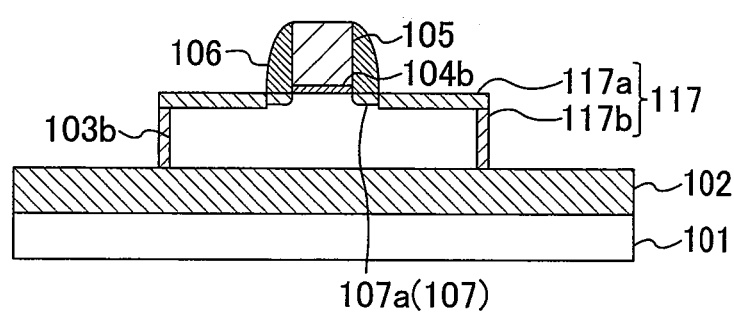

FIGS. 11(a)-11(d) are views each showing a structure of a semiconductor device according to another variation of the first example embodiment of the present disclosure, specifically a semiconductor device having a fin-FET. Note that the two-dimensional structure of the present variation is the same as the two-dimensional structure of the first example embodiment shown in FIG. 1(a). FIG. 11(a) is a cross-sectional view along the line A-A in FIG. 1(a). FIG. 11(b) is a cross-sectional view along the line B-B in FIG. 1(a). FIG. 11(c) is a cross-sectional view along the line C-C in FIG. 1(a). FIG. 11(d) is a cross-sectional view along the line D-D in FIG. 1(a). As shown in FIGS. 11(a)-11(d), the present variation is different from the first example embodiment shown in FIGS. 1(a)-1(e) in the following point.

That is, in the first example embodiment, the gate insulating films 14a-14d each made of, e.g., a silicon oxynitride film and having a thickness of 3 nm are formed on the upper surfaces and side surfaces of the fin-semiconductor regions 13a-13d. By contrast, in the present variation, the gate insulating films 14a-14d are formed only on the side surfaces of the fin-semiconductor regions 13a-13d, and insulating films 24a-24d each made of, e.g., a silicon dioxide film and having a thickness of 20 nm are formed on the upper surfaces of the fin-semiconductor regions 13a-13d. That is, in the present variation, by using only the both side portions of the fin-semiconductor regions 13a-13d as a channel region, a double-gate FET is formed. With such a structure also, as long as the aspect ratio ("Height of Side Surface of Fin-Semiconductor Region"/"Width of Upper Surface of Fin-Semiconductor Region in Gate Width Direction") is high, the same effects as obtained in the first example embodiment can be obtained.

INDUSTRIAL APPLICABILITY

The present disclosure relates to a semiconductor device, a method for fabricating the same, and a plasma doping system, and is particularly useful in obtaining desired characteristics in a semiconductor device of a three-dimensional structure having a fin-type semiconductor region on a substrate

DESCRIPTION OF REFERENCE CHARACTERS

7a First Impurity Region
7b Second Impurity Region
11 Support Substrate
12 Insulating Layer
13a-13f Fin-Semiconductor Regions
13 (14a-14d) Gate Insulating Film
15 Gate Electrode
15A Polysilicon Film
16 Insulating Sidewall Spacer
17 Extension Region
17a First Impurity Region
17b Second Impurity Region
24 (24a-24d) Insulating Film
27 Source/Drain Regions
27a Third Impurity Region
27b Fourth Impurity Region
37 Insulator Region
47 Insulator Region
51 Vacuum Vessel
52 Gas Supply Device
53 Turbo Molecule Pump
54 Pressure Adjustment Valve
55 RF Power Source
56 Sample Electrode
57 Dielectric Window
58 Coil
59 Substrate
60 RF Power Source
61 Exhaust Hole
62 Support Rod
71 Load-Lock Chamber
71a Vacuum Vessel
72 Transfer Chamber
72a Transfer Arm
73 First Plasma Doping Apparatus
73a Vacuum Vessel
74 Second Plasma Doping Apparatus
74a Vacuum Vessel
75 Dry Etching Apparatus
75a Vacuum Vessel

The invention claimed is:

1. A semiconductor device, comprising:
a fin-semiconductor region formed on a substrate;
a gate insulating film formed on at least each of side surfaces of a predetermined portion of the fin-semiconductor region; and
a gate electrode formed on the gate insulating film, wherein
a first impurity which produces a donor level or an acceptor level in a semiconductor is introduced in an upper portion and side portions of the fin-semiconductor region, and oxygen or nitrogen is further introduced as a second impurity in each of the upper portion and side portions of the fin-semiconductor region,
the first impurity and the second impurity are introduced in the fin-semiconductor region located outside the gate electrode, and
said first impurity and said second impurity are not introduced in a portion of said fin-semiconductor region covered by said gate electrode.

2. The semiconductor device of claim 1, wherein a resistance of each of the side portions of the fin-semiconductor region is equal to or less than a resistance of the upper portion of the fin-semiconductor region.

3. The semiconductor device of claim 1, wherein an insulator is formed in the upper portion of the fin-semiconductor region through introduction of the second impurity therein.

4. The semiconductor device of claim 1, wherein the fin-semiconductor region is formed on an insulating layer formed on the substrate.

5. The semiconductor device of claim 1, wherein extension regions are formed in the side portions of the fin-semiconductor region located outside the gate electrode through introduction of the first impurity therein.

6. The semiconductor device of claim 5, further comprising:
insulating sidewall spacers formed on side surfaces of the gate electrode, wherein
the extension regions are formed in portions of the fin-semiconductor region covered with the insulating sidewall spacers, and
source/drain regions are formed in the side portions of the fin-semiconductor region located outside the insulating sidewall spacers through introduction of the first impurity therein.

7. The semiconductor device of claim 1, wherein the fin-semiconductor region is made of silicon.

8. The semiconductor device of claim 1, wherein the first impurity is boron, phosphorus, or arsenic.

* * * * *